(12) United States Patent
Moriyama et al.

(10) Patent No.: US 7,201,511 B2
(45) Date of Patent: Apr. 10, 2007

(54) LIGHT EMITTING MODULE

(75) Inventors: Hideo Moriyama, Tokyo (JP);
Munehiko Yanagita, deceased, late of Utsunomiya (JP); by Koichi Yanagita, legal representative, Utsunomiya (JP)

(73) Assignee: Moriyama Sangyo Kabushiki Kaisha, Tokyo (JP)

( * ) Notice: Subject to any disclaimer, the term of this patent is extended or adjusted under 35 U.S.C. 154(b) by 340 days.

(21) Appl. No.: 10/506,019

(22) PCT Filed: Oct. 24, 2003

(86) PCT No.: PCT/JP03/13664

§ 371 (c)(1),
(2), (4) Date: Aug. 27, 2004

(87) PCT Pub. No.: WO2004/038289

PCT Pub. Date: May 6, 2004

(65) Prior Publication Data

US 2005/0239342 A1    Oct. 27, 2005

(30) Foreign Application Priority Data

Oct. 25, 2002  (JP) ............................. 2002-311681

(51) Int. Cl.
*H01R 33/00* (2006.01)
(52) U.S. Cl. .................. 362/646; 362/249; 362/294; 362/659; 362/800; 313/500; 257/88; 257/99; 257/668
(58) Field of Classification Search ............... 362/241, 362/249, 294, 346, 800, 646, 659; 257/88, 257/668, 99; 313/500
See application file for complete search history.

(56) References Cited

U.S. PATENT DOCUMENTS

| 5,519,596 | A | 5/1996 | Woolverton |
| 5,660,461 | A | 8/1997 | Ignatius et al. |
| 6,345,902 | B2 | 2/2002 | Ohkohdo et al. |
| 6,386,733 | B1 | 5/2002 | Ohkohdo et al. |
| 2001/0024368 | A1* | 9/2001 | Henrici et al. .............. 362/249 |

FOREIGN PATENT DOCUMENTS

| JP | 61-129223 | 8/1986 |
| JP | 62-9287 | 1/1987 |
| JP | 3-1459 | 1/1991 |
| JP | 4-51702 | 4/1992 |
| JP | 6-13164 | 2/1994 |
| JP | 10502772 T | 3/1998 |
| JP | 2000-010507 A | 1/2000 |
| JP | 2000-207922 A | 7/2000 |
| JP | 2000-260206 A | 9/2000 |
| JP | 2001-011708 A | 1/2001 |
| JP | 2003-101072 A | 4/2003 |

* cited by examiner

*Primary Examiner*—Stephen Husar
*Assistant Examiner*—Meghan K. Dunwiddie
(74) *Attorney, Agent, or Firm*—Marshall & Melhorn, LLC

(57) ABSTRACT

The present invention provides a light emitting module, comprising: a plurality of thin plate-shaped conductors (2) spaced apart from each other in a first direction; at least one light source (4) connected between at least one pair of adjoining ones of said conductors; and at least one insulating joint member (4) for mechanically joining said plurality of conductors, wherein said at least one insulating joint member exposes both sides of at least a portion of said conductors where said light source is mounted.

15 Claims, 30 Drawing Sheets

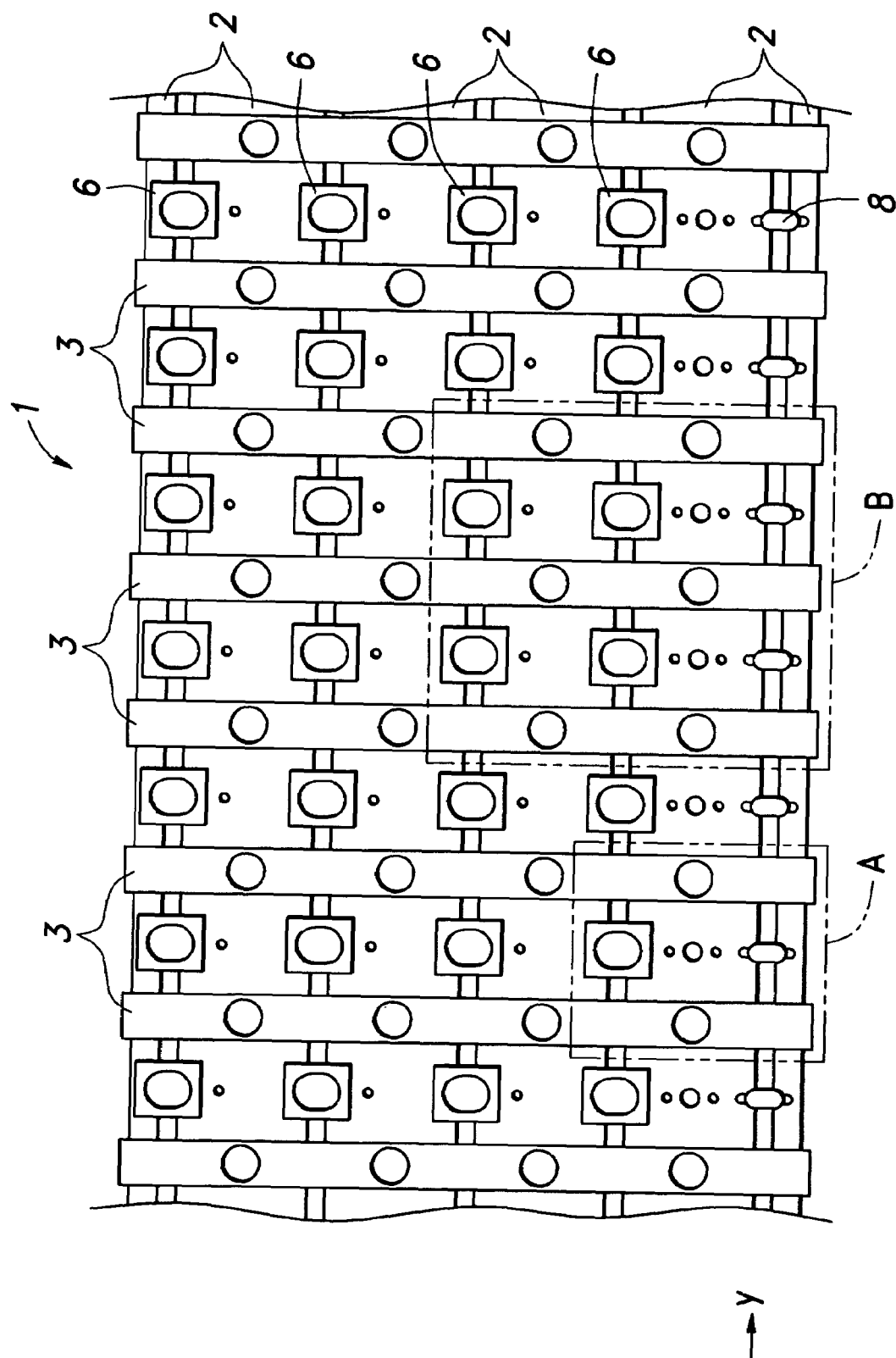

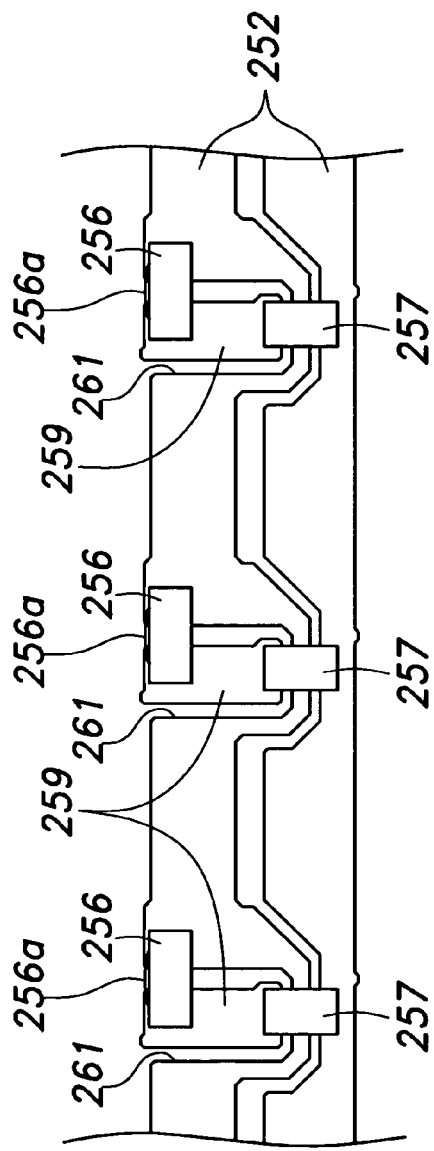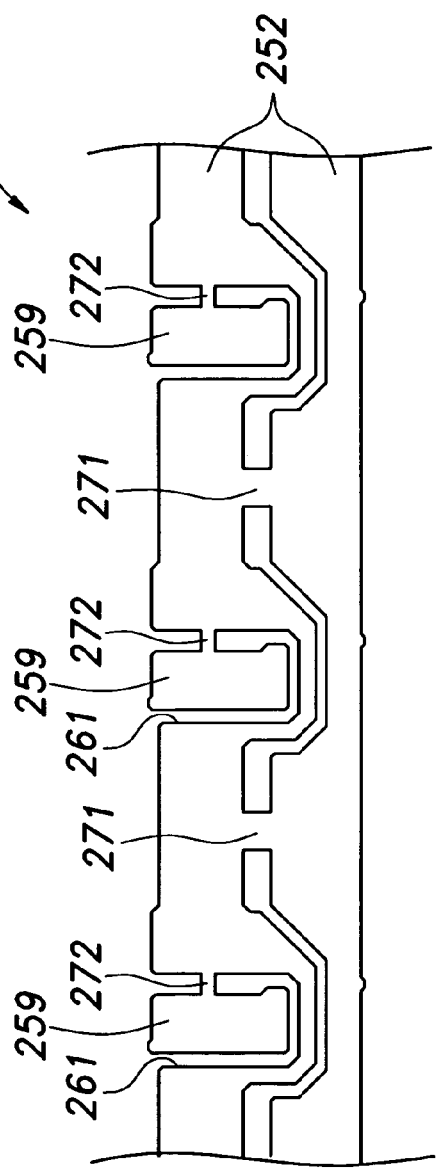

LIGHT EMITTING MODULE

TECHNICAL FIELD

The present invention relates to a light emitting module comprising one or more light sources and a method for manufacturing the light emitting module.

BACKGROUND OF THE INVENTION

It is conventionally known to provide a light emitting module comprising one or more light sources without using a printed circuit board, where the light sources are attached directly between a plurality of conductors extending substantially in parallel (see, e.g., U.S. Pat. No. 5,519,596). In the light emitting module shown in U.S. Pat. No. 5,519,596, a plurality of bus bar pairs are connected via electroconductive extendable joints, and a plurality of LEDs serving as light sources are connected between each bus bar pair by clinching, soldering, spot-welding or the like, to form a so-called matrix circuit comprising a plurality of LED parallel-connections that in turn are connected in series. Before attachment of the LEDs, the bus bars in each pair are connected to each other by integral connection pieces, which, after the attachment of the LEDs, are cut off so as not to short-circuit the LEDs.

The light emitting module fabricated by attaching the LEDs directly onto the conductive bus bars can obviate the use of a printed circuit board, and thus can be manufactured at a reduced cost. Further, the light emitting module has a favorable heat dissipation property because heat can be dissipated efficiently from the exposed bus bars and extendable joints. However, in such a light emitting module, the bus bars in each bus bar pair are mechanically connected to each other by the LEDs, and this can result in stress being imposed upon electrical connections between the bus bars and the LEDs and may undesirably lead to faulty electrical connections. Such a problem tends to be caused particularly when the light emitting module is being carried and thus makes the handling of the module cumbersome.

Japanese Patent Application Laid-Open (kokai) No. 2000-260206 has disclosed processing a metallic sheet into a plurality of bus bar pairs extending in parallel and connected together by joint portions at either ends, attaching light emitting elements mechanically and electrically between each pair of bus bars at predetermined positions by means of clamping, for example, and cutting off part of the joint portions connecting the bus bar pairs to form a flexible light emitting module. In thus formed light emitting module also, the bus bars in each bus bar pair are connected to each other by the light emitting elements (LEDs), and therefore, contains a problem that the stress imposed on the electric connections between the bus bars and the light emitting elements can cause faulty electric connection.

Japanese Patent Application Laid-Open (kokai) No. 2000-10507 has disclosed punching a metallic sheet by means of a punch press machine or the like to form a lead frame comprising a plurality of electrode terminals, to which LED chips are attached, where the electrode terminals are spaced apart from each other at a predetermined interval, subsequently molding a box-shaped reflection case onto the lead frame such that the reflection case covers top and under sides of the lead frame while exposing surfaces of the electrode terminals, and mounting LED chips onto the electrode terminal surfaces by die bonding to whereby manufacture a light emitting display device. In order to prevent warp of the lead frame when molding the box-shaped reflection case, an upper surface of the reflection case is formed with a plurality of pairs of arcuate projections such that each projection pair is aligned with a corresponding LED chip and interposes the LED chip therebetween, and a lower surface of the reflection case is formed with notches at positions between the projections. In this device, the reflection case serves to mechanically support the lead frame, and thus reduces an amount of stress imposed on electric connections between the LED chips and the lead frame. However, the reflection case extending an entire length of the light emitting display device and covering the top and under surfaces of the lead frame hinders heat dissipation as well as makes the device difficult to bend or curve. Further, the light emitting display device uses wire bonding to achieve attachment of the LED chips, and this makes it difficult to achieve attachment of a chip-type LED (or surface mount-type LED), which has electric connection terminals integral with a substantially box-shaped main body and thus has no leads.

BRIEF SUMMARY OF THE INVENTION

In view of such problems of the prior art, a primary object of the present invention is to provide a light emitting module which has an improved heat dissipation property and allows easy handling without imposing stress on connections between light sources and conductors.

A second object of the present invention is to provide a light emitting module which can be bent easily and allows easy handling without imposing stress on connections between light sources and conductors.

A third object of the present invention is to provide a light emitting module that can be manufactured easily and efficiently even when chip-type LEDs are used as light sources.

A fourth object of the present invention is to provide such a light emitting module at low cost and with simple structure.

A fifth object of the present invention is to provide a method for manufacturing such a light emitting module.

A sixth object of the present invention is to provide a method for easily and efficiently manufacturing a light emitting module comprising a desired number of light sources.

A seventh object of the present invention is to provide a light emitting module that can be easily divided into smaller light emitting modules and allows thus-formed smaller light emitting modules to be used without need for additional current-limiting resistors.

According to the present invention, such objects can be accomplished by providing a light emitting module, comprising: a plurality of thin plate-shaped conductors spaced apart from each other in a first direction; at least one light source connected between at least one pair of adjoining ones of the conductors; and at least one insulating joint member for mechanically joining the plurality of conductors, wherein the at least one insulating joint member exposes both sides of at least a portion of the conductors where the light source is mounted. According to such a structure, because the conductors are joined by the insulating joint member, it is possible to keep stress from being placed upon the connections between the light source and the conductors. Further, because the both sides of the light source mount portion of the conductors are exposed, heat generated by the light source can be quickly dissipated. The insulating joint member can be preferably formed by molding a resin material.

According to another aspect of the present invention, there is provided a light emitting module, comprising: a plurality of thin plate-shaped conductors spaced apart from each other in a first direction; at least one light source connected between at least one pair of adjoining ones of the conductors; and at least one insulating joint member for mechanically joining the plurality of conductors, wherein the at least one insulating joint member has an opening exposing at least one side of a portion of the conductors, and the light source is inserted into the opening to be connected to the exposed portion of the conductors. The portion of the conductors exposed by the opening of the insulating joint member is hard to deform because it is surrounded by the insulating joint member, whereby preventing stress from being applied on the connections between the light source and the conductors.

It will be preferred if the opening of the insulating joint member exposes both sides of the conductors, because, as described above, it can allow the heat from the light source to be dissipated quickly. Also, it will be preferred if the opening has a first opening into which the light source is inserted, and a second opening located at an opposite position with respect to the conductors, wherein the second opening diverges in a direction away from the conductors because when the light source is laser welded to the conductors, the irradiation of laser onto the conductors through the second opening can be achieved easily, facilitating the mounting of the light source to the conductors.

Further preferably, dimensions of the opening are determined so as to substantially match those of the light source such that the insulating joint member having the opening serves as a socket for the light source. When the light source comprises a chip-type LED, it will be preferred if the portion of the conductors exposed by the opening of the insulating joint member is provided with extensions for resiliently contact electric connection terminals of the chip-type LED because this can achieve a reliable electric contact between the LED and the conductors. Further, if the insulating joint member has side walls for defining the opening, and a portion of the side walls is formed with an engagement finger for engaging with an upper surface of the chip-type LED when the chip-type LED is inserted into the opening, the mechanical and electrical attachment of the LED can be easily achieved without using laser-welding.

When the light source comprises a bullet-type LED having a pair of substantially parallel extending leads, it will be favorable if the insulating joint member has a partition wall within the opening into which the bullet-type LED is inserted, the partition wall extending across the opening in a second direction substantially perpendicular to the first direction, and the portion of the conductors which is exposed by the opening of the insulating joint member and to which the bullet-type LED is mounted has extensions each extending in the first direction to contact the partition wall or to form a small gap between the partition wall and the extensions. In this way, it is possible to achieve quick and reliable attachment of the bullet-type LED by pushing in the pair of leads of the bullet-type LED between the partition wall and the extensions to thereby cramp them therebetween.

According to another aspect of the present invention, there is provided a light emitting module, comprising: at least three thin plate-shaped conductors spaced apart from each other in a first direction; a plurality of electric elements each connected between associated pair of the conductors such that the plurality of electric elements are connected in series; and an insulating joint member mechanically joining the at least three conductors, wherein the electric elements comprise at least one light source. The electric elements may include a resistor for preventing an excessive current from flowing through the light source. When the electric elements include a resistor, it is possible to adjust the resistance of the resistor to allow the light emitting module to be directly connected to the power source to be used without need for a step-down transformer or the like. Further, if the light sources consist of LEDs, it is possible to prevent an overcurrent from flowing through the LEDs. In such a light emitting module also, because the mechanical joint of the conductors is achieved by the insulating joint members, stress can be kept from being applied upon the connections between the light sources and the conductors. It may be also possible to short-circuit between an arbitrary pair of conductors to prevent light emission at a position corresponding to the short-circuited pair of conductors.

Preferably, the insulating joint member exposes a portion of the at least three conductors, and the exposed portion is formed with holes or grooves extending in a second direction substantially perpendicular to the first direction, because this can allow the conductors to be cut or bent easily along the holes or grooves. Further preferably, the light emitting module comprises a plurality of the insulating joint members, wherein the insulating joint members are spaced apart in the first direction such that the conductors are exposed between adjoining ones of the insulating joint members. In this way, heat can be dissipated efficiently from the exposed conductors. Further, the exposed conductors can be easily bent or flexed, making it possible to change the shape of the light emitting module depending on the place where the module is to be installed or to vary the directions of lights emitted from the light sources.

In a preferred embodiment of the present invention; the light-emitting module further comprises an additional conductor extending in the first direction and spaced apart from the at least three conductors, wherein one end of the additional conductor is connected to one of the at least three conductors that is positioned at one end in the first direction, and the other end of the additional conductor is located at substantially the same position as one of the at least three conductors that is positioned at the other end in the first direction. In such a structure, it is possible to supply electricity to the light emitting module by connecting a power source to one of the at least three conductors that is positioned at the other end in the first direction and to the other end of the additional conductor, and thus the connection with the power source is easy. The one end of the additional conductor may be connected to the conductor positioned at the one end in the first direction via a resistor.

According to another aspect of the present invention, there is provided a light emitting module comprising: a plurality of thin plate-shaped conductors spaced apart from each other in a first direction and extending in a second direction substantially perpendicular to the first direction; at least one light source connected between at least one pair of adjoining ones of the conductors; and a plurality of insulating joint members for mechanically joining the plurality of conductors, wherein the insulating joint members are spaced apart from each other in the second direction such that the conductors are exposed between adjoining ones of the insulating joint members. In this way, it is possible to efficiently dissipate heat from the exposed conductors as well as bend or flex the exposed portions of the conductors easily. A light source may be mounted to the portion of the conductors exposed between adjoining insulating joint members. If holes or grooves extending in the first direction are formed in the portion of the conductors exposed between adjoining insulating joint members, the conductors can be preferably cut or bent along the holes or, grooves. Further preferably, each of the portions of the conductors exposed between adjoining joint members is formed with a hole for electrical connection to an outer device such that when the light emitting module is cut to form a smaller light emitting module, it is possible, irrespective of the position to be cut, to leave portions of the conductors containing the holes for electrical connection to the outer device, to whereby make electric connection terminals for the outer device in the resulting smaller light emitting module.

According to yet another aspect of the present invention, there is provided a light emitting module, comprising: a plurality of thin plate-shaped conductors spaced apart from each other in a first direction and extending in a second direction substantially perpendicular to the first direction; a plurality of light sources each connected between an associated pair of the conductors such that the plurality of light sources are arranged in a matrix pattern; and a plurality of insulating joint members for mechanically joining the plurality of conductors, wherein the plurality of insulating joint members are spaced apart in both of the first and second directions whereby the conductors are exposed between adjoining ones of the insulating joint members. In such a lighting module also, the conductors are joined by the insulating joint members, which can prevent stress from being imposed on the connections between the light sources and the conductors. Further, the heat from the light sources can be quickly dissipated from the portions of the conductors exposed between adjoining joint members, as well as the exposed portions of the conductors can be bent or flexed easily.

In the light emitting module as above, the insulating joint member preferably has a portion extending through a portion of at least one of the conductors in a direction of thickness of the conductors. This can prevent shift between the insulating joint member and the conductors. In one embodiment, the portion of at least one of the conductors through which the insulating joint member extends comprises a through-hole extending in the direction of thickness.

Also preferably, at least one joint member has a through-hole extending in the direction of thickness of the conductors. This can allow a bolt or the like for securing the light emitting module to a support member to be passed through the through-hole.

According to another aspect of the present invention, there is provided a method for manufacturing a light emitting module, comprising the steps of: mechanically joining a plurality of conductors which are spaced apart from each other in a first direction by means of at least one insulating joint member; and mounting at least one light source between at least one pair of adjoining ones of said conductors, wherein in the step of joining the conductors, the insulating joint member exposes both sides of at least a portion of the conductors to which the light source is mounted. In this way, because the joint of the conductors is achieved by the insulating joint member, no stress will be imposed upon the connections between the light source and the conductors. Further, because the both sides of the conductors where the light source is mounted are exposed, the heat generated by the light source can be dissipated quickly.

Preferably, the conductors are electrically separated from each other before the light source mounting step, and the method further comprises a step of conducting a conductivity test every time a light source is attached to the conductors. In this way, it is possible to find out a faulty light source or faulty connection between the light source and the conductors, whereby minimizing a later work for fixation and thus improving the work efficiency.

According to another aspect of the present invention, there is provided a method for manufacturing a light emitting module, comprising the steps of: mechanically joining a plurality of conductors which are spaced apart from each other in a first direction and extending in a second direction substantially perpendicular to the first direction by means of a plurality of insulating joint members while transporting the conductors in the second direction; and mounting a plurality of light sources between at least one pair of adjoining ones of said conductors such that the light sources are arranged in the second direction, wherein the insulating joint members are spaced apart from each other in the second direction so that the conductors are exposed between adjoining ones of the joint members. In this way, it is possible to form a light emitting module comprising an arbitrary number of light sources arranged in the second direction (or in the direction of extension of the conductors) and connected between an associated pair of conductors. Because the conductors are joined by the insulating joint members, stress can be kept from being placed upon the connections between the light sources and the conductors. Further, heat generated by the light sources can be quickly dissipated from the portions of the conductors exposed between adjoining joint members In the step of joining the conductors, the conductors which are spaced apart from each other may be individually transported in the second direction. Alternatively, it is also possible that in the step of joining the conductors, the conductors are transported in a state that they are connected to each other via connection pieces to form an integral patterned conductor and insulating joint members are formed so as to expose the connection pieces, and the method further comprises, after the step of joining the conductors, a step of cutting off the connection pieces to separate the conductors from each other. In the case that the conductors separated apart from each other are individually transported, wasted material can be reduced because there is no part to be cut off. On the other hand, in the case that the conductors are connected via the connection pieces to form a unitary patterned conductor, easier handling thereof can be achieved. Further, when at least one of the conductors is provided with pilot holes arranged at prescribed intervals in the second direction for engagement with pilot pins of a progressive manufacturing line for transporting the patterned conductor, it is not necessary for each conductor to be provided with the pilot holes because they can be transported integrally with the conductor provided with the pilot holes. Such a patterned conductor can be preferably formed by press-working a metallic thin plate.

According to still another aspect of the present invention, there is provided a method for manufacturing a light emitting module, comprising the steps of: mechanically joining a plurality of conductors which are spaced apart from each other in a first direction by means of a plurality of insulating joint members while transporting the conductors in the first direction; and mounting a plurality of light sources between an associated pair of said conductors, wherein at least some of the light sources are connected in series via the conductors and the insulating joint members are spaced apart in the first direction such that the conductors are exposed between adjoining ones of the insulating joint members. This can allow an arbitrary number of conductors to be transported and hence, the number of light sources that are connected in series via the conductors is not limited. Therefore, it is possible, for example, to easily form a light emitting module comprising a number of light sources that match the voltage of a power supply to be connected or a number of light sources that are required for a place where the light source is to be installed. In this case also, the conductors are joined by the insulating joint members and thus, no stress will be imposed upon the connections between the light sources and conductors. Further, the heat generated by the light sources can be swiftly dissipated from the portions of the conductors exposed between adjoining joint members.

In the step of joining the conductors, the conductors are preferably transported in a state that they are connected to each other via connection pieces to form an integral patterned conductor and the insulating joint members are formed so as to expose the connection pieces, and the method further comprises, after the step of joining the conductors, a step of cutting off the connection pieces to separate the conductors from each other. The use of the patterned conductor can make the handling easier because the conductors are integral to each other.

Further, in the case that the direction of transportation of the patterned conductor coincides with the first direction, it will be preferable if the patterned conductor comprises an additional conductor extending in the first direction and connected to the plurality of conductors via connection pieces, and the method further comprises the step of: joining the additional conductor to the plurality of conductors by means of an insulating joint member; cutting off the connection pieces connecting the additional conductor to the plurality of conductors; and connecting an end of the additional conductor to one of the plurality of conductors at one end of the light emitting module via an electric element (such as a resistor). In this way, an end of the additional conductor and one of the plurality of conductors at the other end of the light emitting module can be used for connection to a power source. In other words, the terminals for connection to the power source can be provided at the same end of the light emitting module, thereby facilitating the connection to the power source.

According to another aspect of the present invention, there is provided a method for manufacturing a light emitting module, comprising the steps of: mechanically joining a plurality of conductors which are spaced apart from each other in a first direction and extending in a second direction substantially perpendicular to the first direction by means of a plurality of insulating joint members; mounting a plurality of light sources between at least one pair of adjoining ones of the conductors; and after the light source mounting step, cutting the conductors along a line extending substantially in the first direction at a prescribed position in the second direction. This can form a light emitting module comprising a desired number of light sources arranged in the second direction. Further, the conductors are joined by the insulating joint members to prevent stress from being upon the connections between the light sources and the conductors.

According to yet another aspect of the present invention, there is provided a method for manufacturing a light emitting module, comprising the steps of: mechanically joining more than two conductors which are spaced apart from each other in a first direction and extending in a second direction substantially perpendicular to the first direction by means of a plurality of insulating joint members; mounting a plurality of light sources between at least two pairs of adjoining ones of the conductors such that the light sources are arranged in the first direction; and after the light source mounting step, cutting the conductors along a line extending substantially in the second direction, which is perpendicular to the first direction, at a prescribed position in the first direction. This can form a light emitting module comprising a desired number of light sources arranged in the first direction. Further, the conductors are joined by the insulating joint members to prevent stress from being upon the connections between the light sources and the conductors.

According to another aspect of the present invention, there is provided a light emitting module, comprising: a plurality of thin plate-shaped conductors spaced apart from each other in a first direction; at least one light source connected between at least one pair of adjoining ones of the conductors; at least one insulating joint member for mechanically joining the plurality of conductors; and an additional conductor spaced apart from the plurality of conductors and extending in the first direction, wherein one end of the additional conductor is connected to one of the plurality of conductors located at one end in the first direction while the other end of the additional conductor is disposed substantially at the same position as one of the plurality of conductors located at the other end in the first direction, and wherein the at least one insulating joint member has an opening exposing at least one side of a portion of the plurality of conductors and the light source is inserted into the opening to be connected to the portion of the conductors exposed by the opening. In this way, the one of the plurality of conductors located at the other end in the first direction and the other end of the additional conductor are positioned close to each other, whereby it is easily achieved to connect them to a power source so as to supply electric power to the light emitting module. Further, because the light source is inserted into the opening of the insulating joint member, it is possible to keep stress from being placed upon the connections between the light source and the conductors and thus easy handling can be achieved. In such a light emitting module, it is possible that a plurality of electric elements including at least one light source are connected in series via the plurality of conductors.

Preferably, the connection between the other end of the additional conductor and the one of the plurality of conductors located at the other end in the first direction is achieved via a resistor although the connection may be also achieved by a conductive member such as a jumper wire. Further, it will be favorable if the insulating joint member also joins the additional conductor and the conductor located at the other end in the first direction to each other because it can increase the mechanical strength.

Preferably, the insulating joint member has an additional opening in which the resistor is inserted. This keeps stress from being placed upon the connections between the resistor and the conductors, to whereby prevent undesirable detachment of the resistor or faulty connection. Aligning the opening for receiving the light source and the opening for receiving the resistor with each other in the first direction can position the openings close to each other, and thus the openings can be formed in the insulating joint member efficiently.

According to yet another aspect of the present invention, there is provided a light emitting module, comprising: a plurality of thin plate-shaped conductors spaced apart from each other in a first direction and extending in a second direction substantially perpendicular to the first direction; at least one light source each connected between an associated pair of the conductors; and a plurality of insulating joint members for mechanically joining the plurality of conductors, wherein a resistor is connected in series with each of the at least one light source. Such provision of resistors which are series-connected to respective light sources can allow a resistance of each resistor to be determined depending on the characteristics of an associated light source so that when a predetermined voltage (e.g., 4V) is applied upon a light source (e.g., LED), a predetermined rated current flows through the light source. This can allow a single light emitting module to contain a plurality of light sources having different characteristics, for example. Further, in a case that such a light source is cut at desired portions to form a smaller light source(s), the resulting smaller light source automatically contains resistors having suitable resistances that match the light sources contained and thus, external resistors are not separately needed. Therefore, it is easy for a user to cut the light emitting module as desired to form smaller light emitting modules and to arrange them in various patterns.

Preferably, the insulating joint members are provided one for each of the at least one light source, and each of the insulating joint members is formed with openings for receiving an associated light source and resistor connected in series to the light source. In this way, the insulating joint members can serve as an integral socket for the light source and resistor for steadily holding the same. This makes carrying or cutting of the light emitting module easier. In one embodiment, a conductive piece is provided between adjoining ones of the plurality of thin plate-shaped conductors such that the series-connected at least one light source and resistor are connected to each other via the conductive piece, and the insulating joint member mechanically joins the conductive piece and the conductors. Further, the light emitting module may include, as light sources, not only a bullet-type LED or chip-type LED but also a bare-chip LED.

According to still another aspect of the present invention, there is provided a light emitting module, comprising: a plurality of thin plate-shaped conductors spaced apart from each other in a first direction and extending in a second direction substantially perpendicular to the first direction; a plurality of conductive pieces disposed between adjoining ones of the conductors so as to be spaced apart from each other in the second direction; a plurality of light sources connected between adjoining ones of the conductive pieces; a plurality of resistors for connecting selected ones of the conductive pieces to one or the other of a pair of the conductors interposing the selected conductive pieces therebetween; and at least one insulating joint member for mechanically joining the plurality of conductors and the conductive pieces. In such a light emitting module, a plurality of light source series-connections each comprising light sources connected in series via conductive pieces can be connected in parallel between an associated conductors via resistors, to thereby form a so-called series-parallel connection. The number of light sources contained in each light source series-connection may be arbitrarily selected by choosing the position of the resistors for connecting the conductive pieces to the conductors. As a particular case thereof, when each light source series-connection comprises only a single light source, the light sources are connected in parallel between the pair of conductors. Alternatively, only a single light source series-connection may be connected between the pair of conductors. Thus, in this light emitting module, it is possible to connect the light sources in any of series, parallel or series-parallel connections by changing the attachment positions of the resistors or the like.

According to yet another aspect of the present invention, there is provided a light emitting module, comprising: first and second conductors spaced apart from each other in a first direction and extending in a second direction substantially perpendicular to the first direction; and at least one light source connected between the first and second conductors, wherein the first conductor has a widthwise recess in which a conductive piece is disposed such that the conductive piece is spaced apart from a portion of the first conductor in the second direction, and wherein the at least one light source is connected to the conductive piece and the portion of the first conductor which are spaced apart from each other in the second direction, and the conductive piece is connected to the second conductor via a resistor.

In such a light emitting module, the light source is connected between the conductive piece and the portion of the first conductor spaced apart in the second direction and thus, when a side-view LED having a light emitting surface on its side is used as a light source, it is possible to emit light in a direction perpendicular to the direction of extension of the first and second conductors. Further, provision of a resistor connected in series to each light source can allow the resistance of each resistor to be determined depending on the characteristics of an associated light source.

Preferably, the widthwise recess of the first conductor is provided on a side facing away from the second conductor, and the resistor strides across the first conductor to connect the conductive piece to the second conductor. In this way, when the light source consists of a side-view LED, it is possible to mount the light source such that the light emitting surface of the light source is substantially aligned with a widthwise edge of the first conductor away from the second conductor, so as to prevent the conductor to interfere with the light emitted from the light source. Further preferably, the light emitting module may further comprise at least one insulating joint member for mechanically joining the first and second conductors and the conductive piece. This can prevent stress from being placed upon the electric connections between the light source and the conductive piece or conductor.

Other and further objects, features and advantages of the invention will appear more fully from the following description.

BRIEF DESCRIPTION OF THE DRAWINGS

Now the present invention is described in the following with reference to the appended drawings, in which:

FIG. 4 is a partial plan view showing a light emitting module manufactured in accordance with a preferred embodiment of a method for manufacturing a light emitting module of the present invention;

FIG. 5a is a plan view of a light emitting module formed by cutting the patterned conductor along the line A in FIG. 4 while

FIG. 8a is a cross-sectional view taken along the line VIII—VIII in FIG. 6, while

FIG. 12a is a plan view of a light emitting module formed by cutting the patterned conductor along the line C in FIG. 10, while

FIG. 20b is a partial cross-sectional view taken along the line XXb—XXb in FIG. 20a;

FIG. 23a is a partial plan view of a light emitting module formed by cutting the light emitting module of FIG. 22 along the line F, while

FIG. 33 is a partial plan view of the light emitting module of FIG. 32 with joint members being omitted; and FIG. 34 is a partial plan view showing a patterned conductor suitable for forming the light emitting module of FIG. 32.

DETAILED DESCRIPTION OF THE PREFERRED EMBODIMENTS

In the following, preferred embodiments of the present invention will be described with reference to the drawings.

Figure 1:
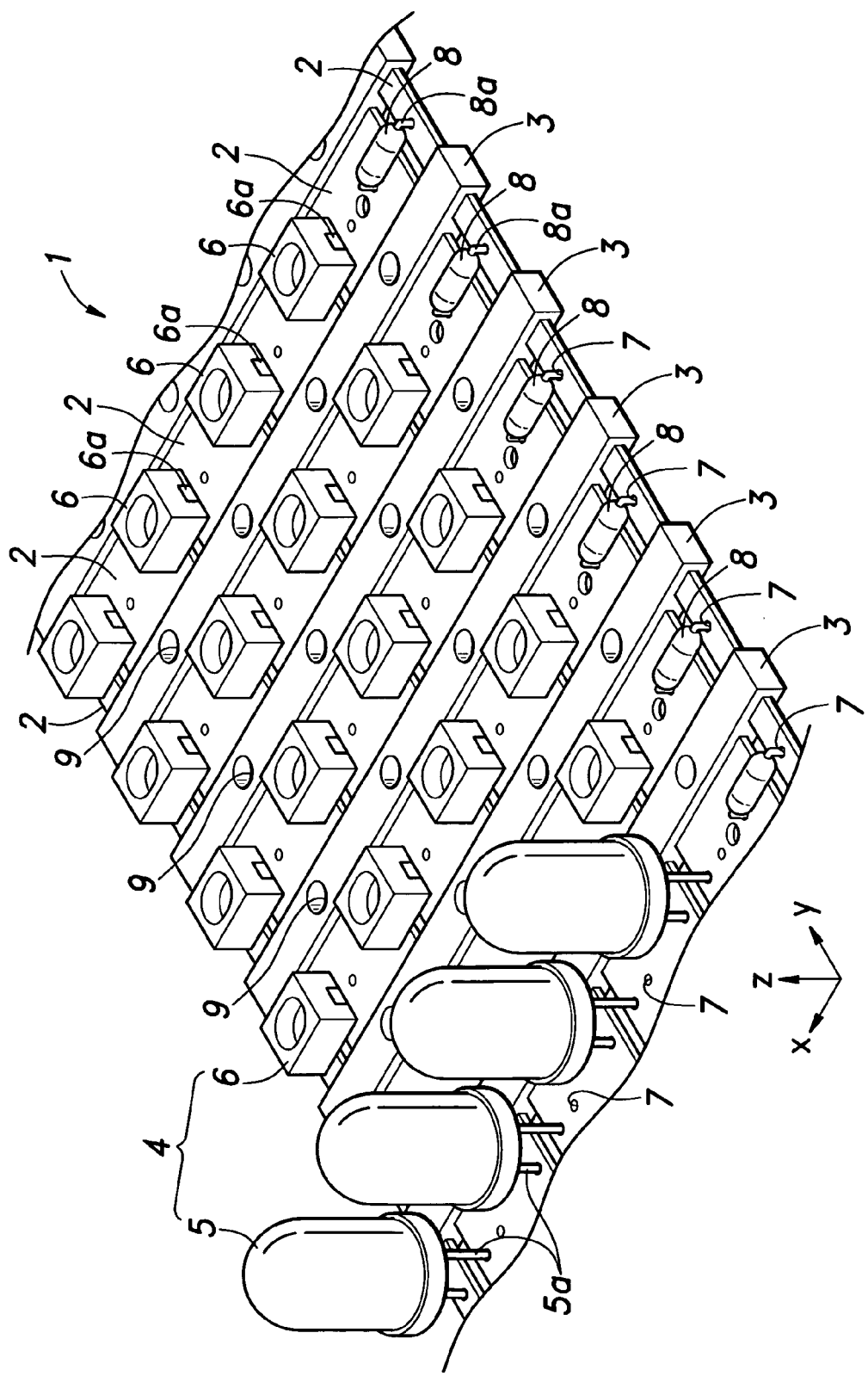
FIG. 1 is a partial perspective view showing a preferred embodiment of a light emitting module according to the present invention.

FIG. 1 is a partial perspective view showing one preferred embodiment of a light emitting module according to the present invention. As shown in the drawing, the light emitting module 1 comprises: a plurality (six in this embodiment) of thin plate-shaped conductors 2 spaced apart from each other in a first direction (in a direction of x-axis in FIG. 1) and extending in a second direction (in a direction of y-axis in FIG. 1) substantially perpendicular to the first direction; a plurality of insulating joint members 3 for mechanically joining the conductors 2; a plurality of in LEDs 4 mounted between adjoining conductors 2 to serve as light sources. The LEDs 4 are generally arranged in a matrix pattern at predetermined intervals in the first and second directions. The x-axis direction may sometimes be referred to as a column direction while the y-axis direction may be referred to as a row direction.

In this embodiment, the LEDs 4 comprise so-called bullet-type LEDs (or lamp-type LEDs) 5 having a pair of substantially parallel leads 5a serving as electric connection terminals as well as so-called chip-type LEDs 6 having electric connection terminals 6a integral with a main body. Of course, the LEDs 4 may comprise LEDs of only one type. The chip-type LED 6 can have significantly reduced lengthwise, widthwise and height-wise dimensions such as 3.5 mm×2.5 mm×2.3 mm. The chip-type LEDs 6 shown in FIG. 1 have a light emitting surface on their top. Other light sources such as incandescent lamps may also be used.

The LEDs 4 are connected to exposed portions of the conductors 2 that are not covered by the insulating joint members 3. Each bullet-type LED 5 is attached to the associated conductors 2 with the leads 5a being inserted into lead insertions holes 7 formed in exposed portions of the conductors 2. The chip-type LEDs 6 can be attached to the conductors 2 by laser welding or spot welding, for example.

In the light emitting module 1, the LEDs 4 aligned in the second direction are connected in parallel between the associated pair of conductors to form an LED parallel-connection. It should be appreciated that since the conductors other than those positioned at either end are used commonly in different conductor pairs, five conductor pairs are formed in the light emitting module 1 of FIG. 1, four of which are used to form LED parallel-connections, and the conductors in the remaining conductor pair positioned at an end is used to connect a plurality of resistors 8 in parallel therebetween in the same manner that the LEDs 4 are connected. The attachment of the resistors 8 to the conductors 2 can be also achieved easily by inserting leads 8a of the resistors 8 into lead insertion holes 7 formed in the conductors 2 beforehand. It may be also possible to use chip-type resistors (not shown) having no leads 8a. The four LED parallel-connections and one resistor parallel-connection are connected in series in the first direction via conductors 2 to form a matrix circuit as a whole. Thus, application of voltage across the end conductors 2 can cause an electric current to flow through the LEDs 4 to make them emit light. Because the resistors are connected in series to the LEDs 4, it is possible, upon application of a certain voltage, to prevent an excessive voltage from being applied to the LEDs 4 without using a step-down transformer or the like. It should be understood that the resistors 8 may be connected between the conductors of a conductor pair other than that positioned at an end so long as the resistors 8 are connected in series to the LED parallel connections. Another element such as a switch or a positive temperature coefficient thermistor may be used instead of or in addition to the resistors 8. It is also possible to use an electroconductive member such as a jumper wire in place of the LEDs 4 at a certain row of the matrix to short-circuit the adjoining conductors, to thereby prevent light emission at the row.

In this embodiment, the insulating joint members 3 that join the conductors 2 each extend in the first direction from the conductor 2 at one end to the conductor 2 at the other end. The insulating joint members 3 are spaced apart from each other in the second direction to expose both sides of portions of the conductors 2 between adjoining joint members 3. As mentioned above, the LEDs 4 are attached to the exposed portions of the conductors 2. The insulating joint members 3 are preferably made of resin and can be formed by molding (e.g., insert molding). Each insulating joint member is formed with a plurality of through-holes 9 such that a bolt or screw (not shown) may be inserted into at least one of the through-holes 9 to secure the light emitting module 1 to a support member (not shown). Portions of each conductor 2 aligned with the through-holes 9 of the insulating joint member 3 are formed with a hole 22 (see FIG. 2) having a larger diameter than the through-hole 9 so that the conductor 2 is not exposed in the through hole 9 when the joint member 3 is formed. This can prevent a voltage from being applied to a metallic bolt inserted into the through-hole 9. Further, because the insulating joint member 3 extends through the holes 22 of the conductor 2 in a direction of thickness of the conductor 2 (z-axis direction in FIG. 1), it is possible to prevent the insulating joint member 3 from inadvertently sliding with respect to the conductor 2.

In the light emitting module 1 having the above structure, because the mechanical joint of the plurality of conductors 2 is achieved by the insulating joint members 3 formed by molding, it is possible to keep stress from being imposed upon connections between the LEDs 4 and the conductors 2. Therefore, when the light emitting module 1 is being carried or when the light emitting module 1 is used in an environment such as in an automobile where the module 1 tends to be applied with substantial oscillations, there is no concern about undesirable open circuit. The insulating joint members 3 expose both sides of various portions of the conductors 2 inclusive of the portions where the LEDs 4 are mounted, and the thickness of the joint members 3 serves to ensure that a space is created between the conductors 2 and the support member (not shown) when the light emitting module 1 is secured to the support member, whereby achieving favorable heat dissipation characteristics. Further, because the conductors 2 are of a thin plate-shape, they can be easily bent or flexed at portions where the joint members 3 are not provided.

Figure 2:
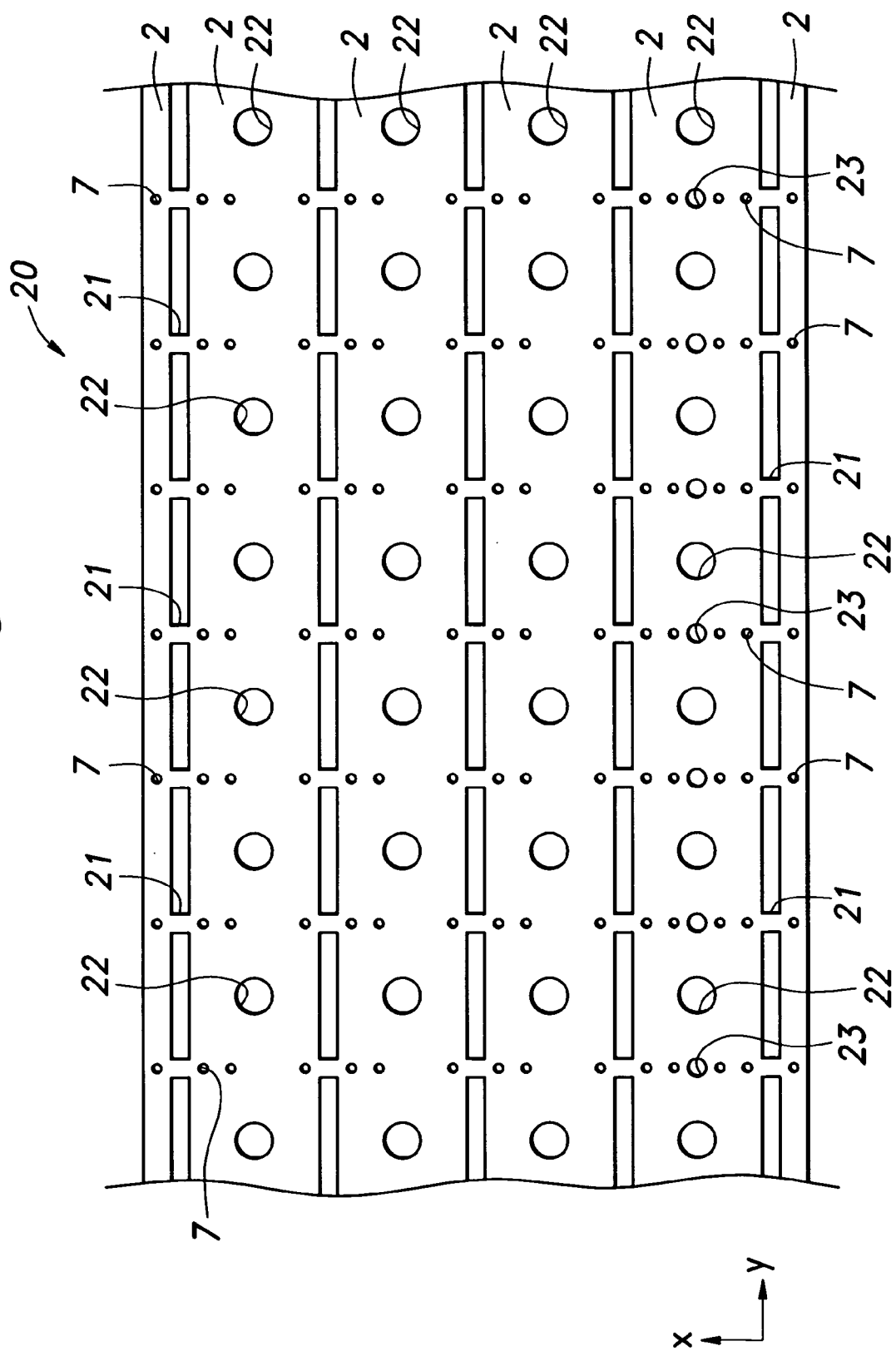
FIG. 2 is a partial plan view of a patterned conductor used in a preferred embodiment of a process for manufacturing the light emitting module shown in FIG. 1.
Figure 3:
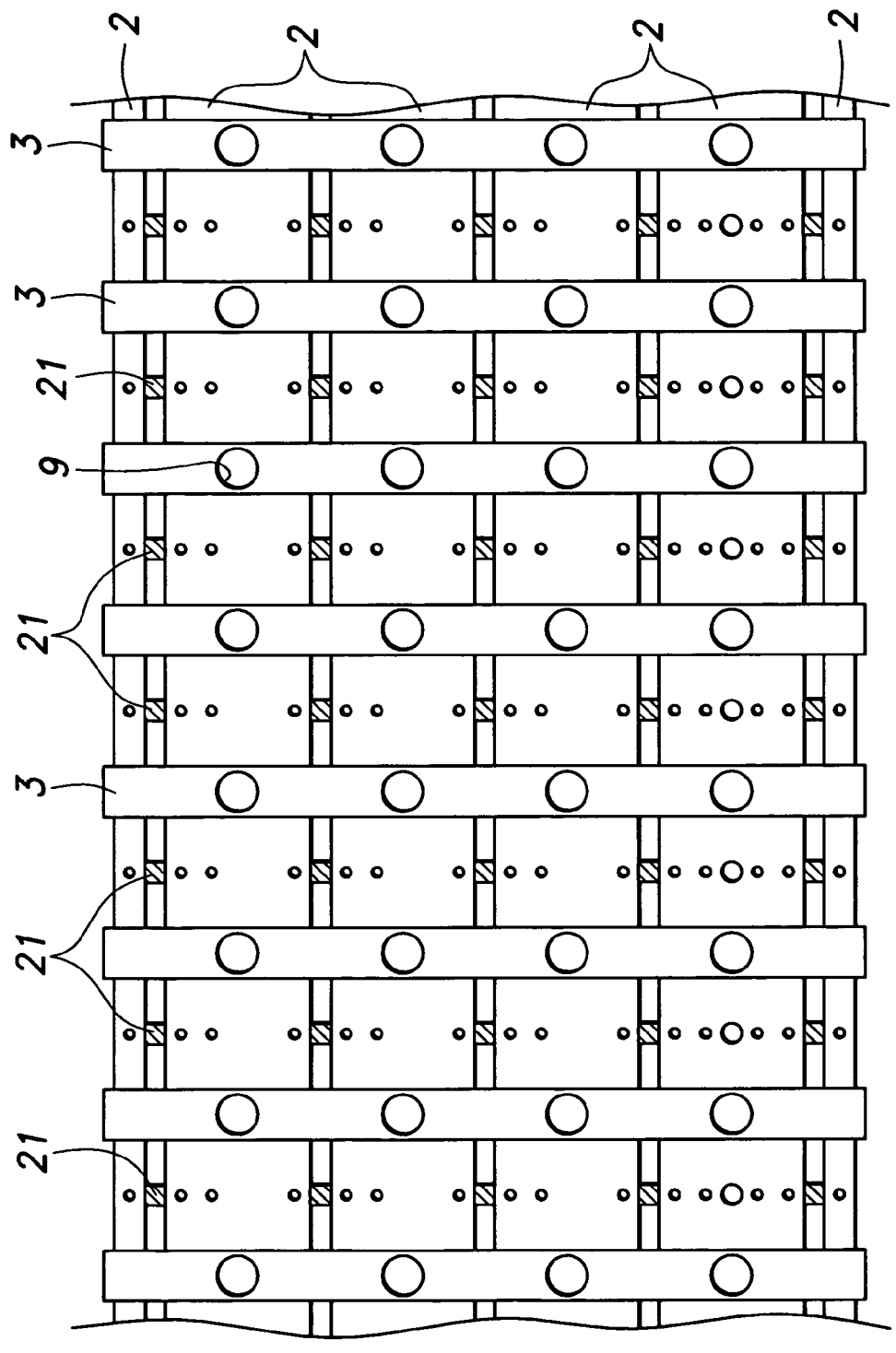
FIG. 3 is a partial plan view showing a state that insulating joint members are formed on the patterned conductor shown in FIG. 2.

Now, with reference to FIGS. 2—4, a preferred method for manufacturing the light emitting module 1 of FIG. 1 is described. It should be noted that in these drawings, component parts corresponding to those of FIG. 1 are denoted with the same reference numerals.

According to the preferred embodiment of the present invention, first, a thin plate-shaped conductor (patterned conductor) 20 having a prescribed pattern as shown in the plan view of FIG. 2 is prepared. The patterned conductor 20 comprises: a plurality (e.g., six) of thin plate-shaped conductors 2 spaced apart from each other in the first direction (x-axis direction in the drawing) and extending in the second direction (y-axis direction in the drawing) substantially perpendicular to the first direction; and a plurality of connection pieces 21 connecting the conductors 2 in the first direction. The conductors 2 positioned at either end have a narrower width than the central four conductors 2.

As described above, portions of each of the central four conductors 2 aligned with the through-holes 9 of the insulating joint members 3 are formed with holes 22 having a slightly larger diameter than the through-holes 9. Further, in the conductor 2 second to the bottom in FIG. 2 is formed with pilot holes 23 which are arranged at a predetermined interval in the second direction such that when the patterned conductor 20 is transported by a progressive manufacture line (not shown), which may include a progressive press machine or the like, the pilot holes 23 can engage pilot pins of a transportation mechanism of the progressive manufacture line. Thus, in this embodiment, the direction of transportation (or lengthwise direction) of the patterned conductor 20 is perpendicular to the first direction in which the conductors 2 are spaced apart from each other and coincides with the second direction in which the conductors 2 extend. In addition to the conductors 2 for mounting the light sources thereon, it may be possible to provide an additional conductor (side frame) extending in the second direction in parallel with the end conductor 2 and connected to the same via connection pieces and to form the pilot holes in the additional conductor.

Further, as described above, in order to facilitate attachment of the LEDs 5 and resistors 8 having leads 5a, 8a, respectively, the patterned conductor 20 is formed with holes 7 for receiving the leads 5a, 8a at appropriate positions determined by taking into account a distance between the pair of leads of each element to be mounted. A surface (top surface) on the side of the patterned conductor 4 to which the LEDs 4 are mounted may be plated with a light-reflecting material to effectively serve as a reflector surface.

The patterned conductor 20 as described above can be formed efficiently by press-working a tape-shaped metallic thin plate having the pilot holes 23 preformed therein while transporting it by the progressive press machine. The patterned conductor 20 thus formed is tape-shaped and can be wound into a roll. Instead of the press-working, the patterned conductor 20 may be formed by etching a metallic thin plate having an appropriate length.

Next, as shown in FIG. 3, the insulating joint members 3 are formed by molding to join the conductors 2 in the first direction where the connection pieces 21 are exposed by the joint members 3. The molding can be carried out in the same progressive manufacturing line as that for performing the press-working. It may be also possible to roll up the patterned conductor 20 and carry it to another manufacturing line where the molding is carried out. After the molding, the connection pieces 21 are cut off by press-working or the like as shown by hatching in FIG. 3. This electrically separates the conductors 2 from each other but the joint members 3 keep the conductors 2 mechanically held together.

Then, as shown in FIG. 4, elements such as the chip-type LEDs 6 and resistors 8 are attached to the conductors 2 to form the light emitting module 1. The attachment of the chip-type LEDs 6 to the conductors 2 can be achieved by laser welding, spot welding, soldering, etc. Because both of the upper and under sides of the light source mount portions of the conductors 2 are exposed, it is possible to place the chip-type LEDs on the upper side of the conductors 2 and carry out laser welding by irradiating laser onto the light source mount portion from underside. The resistors 8 having the leads 8a are attached to the conductors 2 by inserting the leads 8a into the holes 7 of the conductors 2. Though not shown in FIG. 4, if the LEDs 5 having leads 5a are used instead of the chip-type LEDs 6, the attachment of the LEDs 5 can be achieved easily by inserting the leads 5a into the holes 7 of the conductors 2 in the same fashion as in the attachment of the resistors 8. It is also possible to conduct laser welding or the like after the insertion of the leads 5a, 8a into the holes 7.

In this embodiment, when the LEDs 6 are mounted to the conductors 2, the conductors 2 are electrically separated from each other and therefore, it is possible to perform an electric conduction test after each attachment of the LEDs 6, to thereby check the state of connection between the LEDs and conductors 2 and/or the integrity of the LEDs 6 themselves. This can allow a faulty LED 6 or a faulty connection between LEDs 6 and conductors 2 to be found at an earlier stage, minimizing a later work for fixation and thus improving the work efficiency.

In the above embodiment, the insulating joint members 3 are formed by molding on the patterned conductor 20, in which the conductors 2 are connected together via integral connection pieces 21, to join the conductors 2 together. However, if each conductor 2 has a relatively short length, it is possible to simply arrange the conductors 2 at certain intervals and then join the conductors 2 by molding. Further, in the case that the conductors 2 are lengthy, if each conductor 2 is formed with the pilot holes 23 or the like and can be transported individually, it is possible to arrange the separated conductors 2 such that they are spaced apart from each other in the widthwise direction and then join the conductors 2 by molding while transporting the same.

Figure 5A:
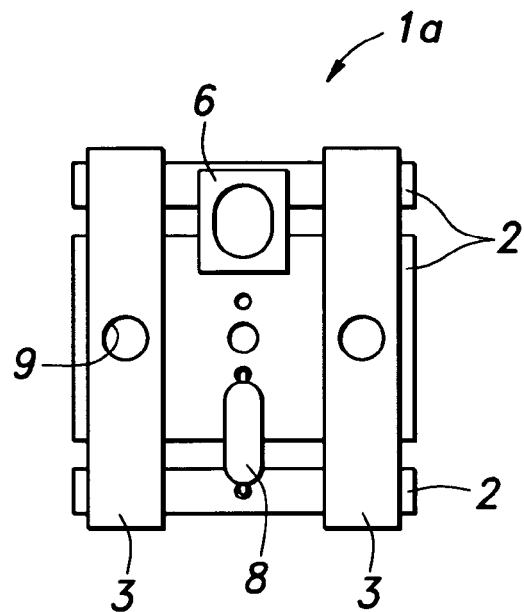
Figure 5B:
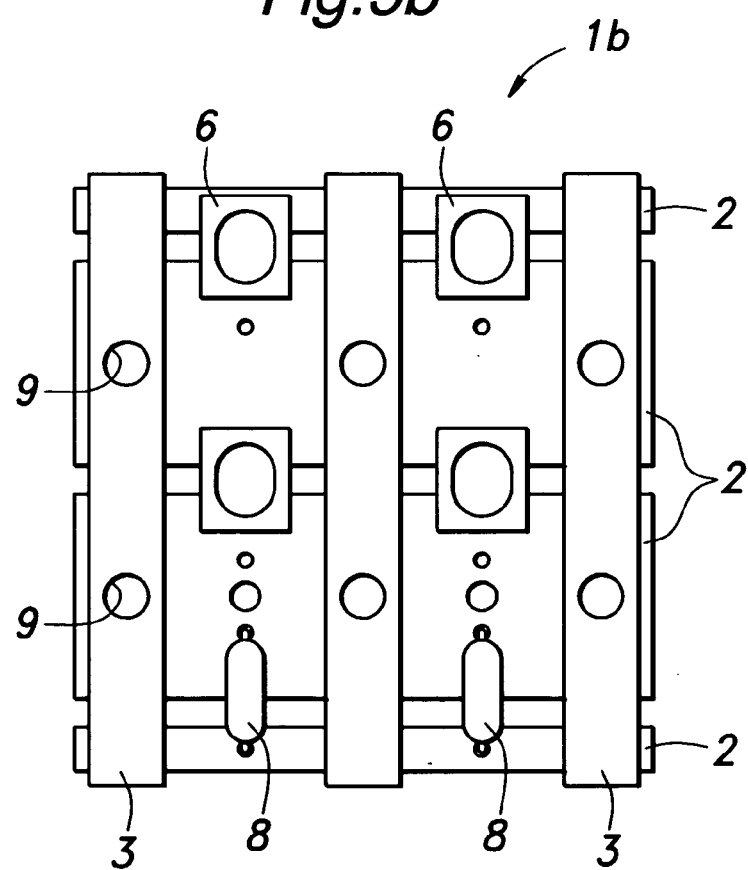
FIG. 5b is a plan view of a light emitting module formed by cutting the patterned conductor along the line B in FIG. 4.

The light emitting module 1 having the LEDs 6 arranged in the matrix fashion as shown in FIG. 4 may be cut at appropriate positions to form a smaller light emitting module comprising the LEDs 6 in an arbitrary number of rows and columns. For instance, cutting along the line A in FIG. 4 provides a two-row, one-column light emitting module 1a comprising a series-connected single LED 6 and single resistor 8, as shown in FIG. 5a. Cutting along the line B in FIG. 4 provides a three-row, two-column light emitting module 1b comprising two pairs of parallel-connected LEDs 6 and a pair of parallel-connected resistor 8, with the two LED pairs and the resistor pair being connected in series. In these light emitting modules 1a, 1b also, the conductors 2 on which the LEDs 6 are mounted are mechanically joined by the joint members 3, preventing stress from being placed upon the connections between the LEDs 6 and the conductors 2. Further, because both sides of the conductors 2 are exposed between adjoining insulating members 3 and the LEDs 6 are mounted to the exposed portions, it is possible to quickly dissipate the heat from the LEDs 6 via the exposed conductors 2.

Figure 6:
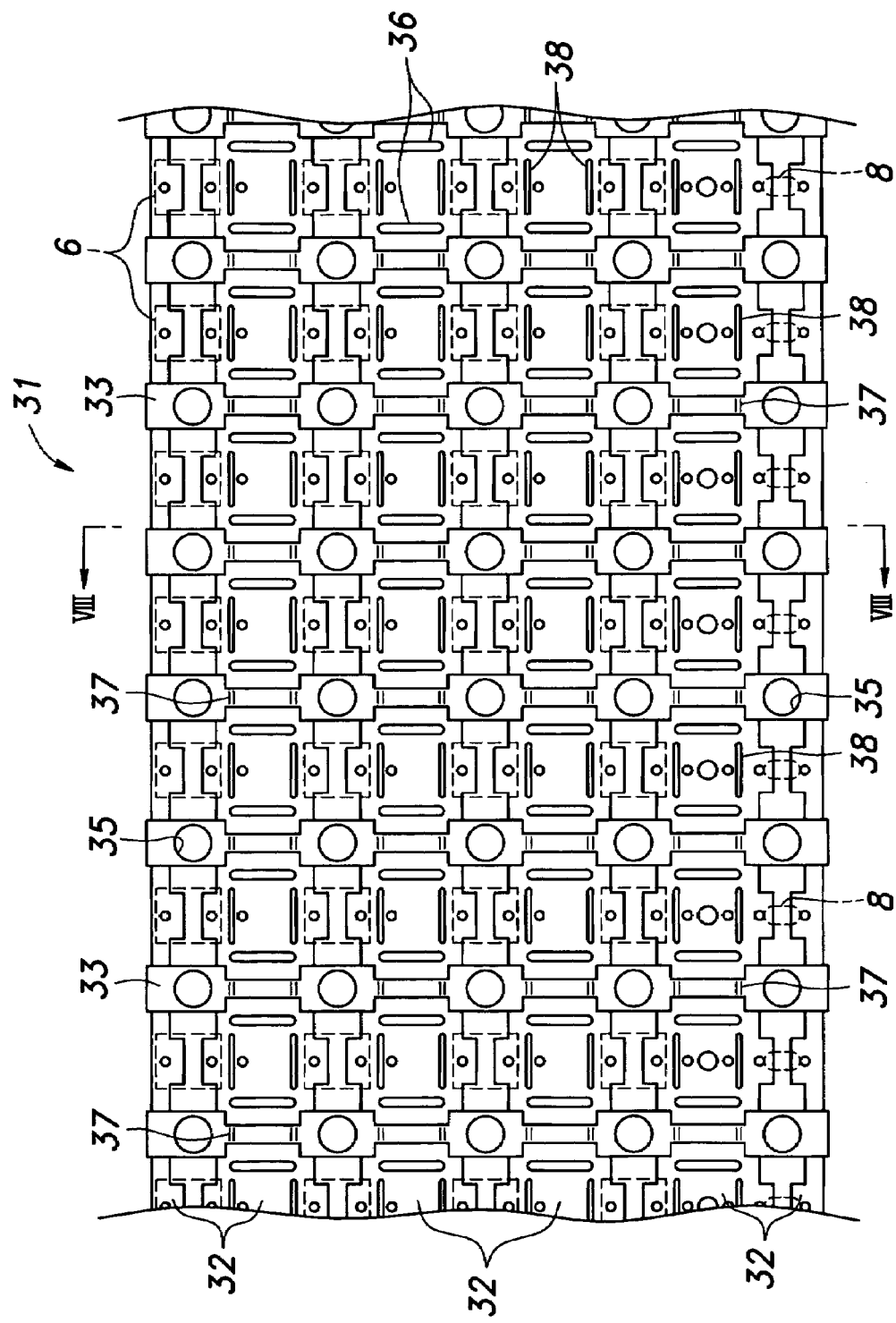
FIG. 6 is a partial plan view showing another embodiment of a light emitting module according to the present invention.

FIG. 6 is a top plan view showing another embodiment of a light emitting module according to the present invention. In this drawing, the chip-type LEDs 6 and resistors 8 are shown in broken lines. Of course, bullet-type LEDs 5 may be used instead of the chip-type LEDs 6. Like the light emitting module 1 shown in FIG. 1, this light emitting module 31 comprises a plurality of conductors 32 spaced apart from each other in one direction and insulating joint members 33 for mechanically joining the conductors 32, where the LEDs 6 and resistors 8 are connected between adjoining conductors 32.

Figure 7A:
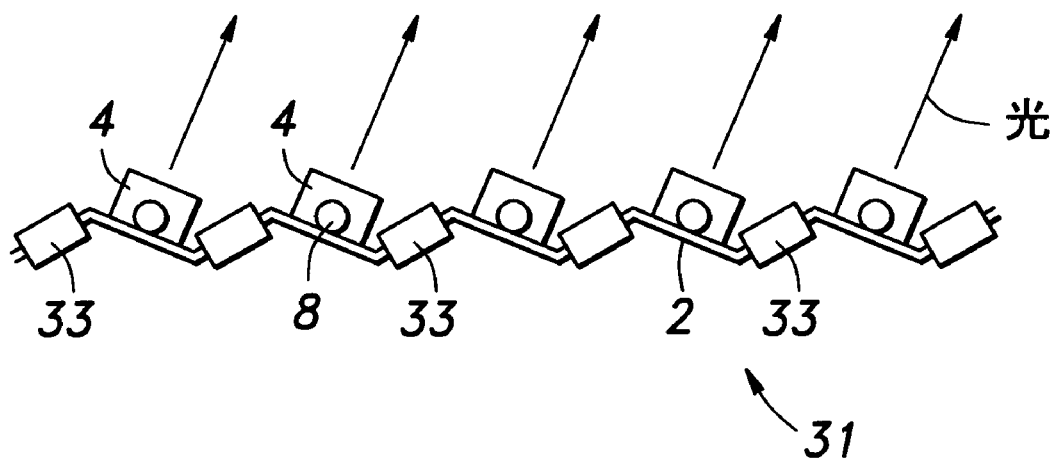
FIGS. 7a and 7b show different ways of bending of the light emitting module shown in FIG. 6.
Figure 7B:
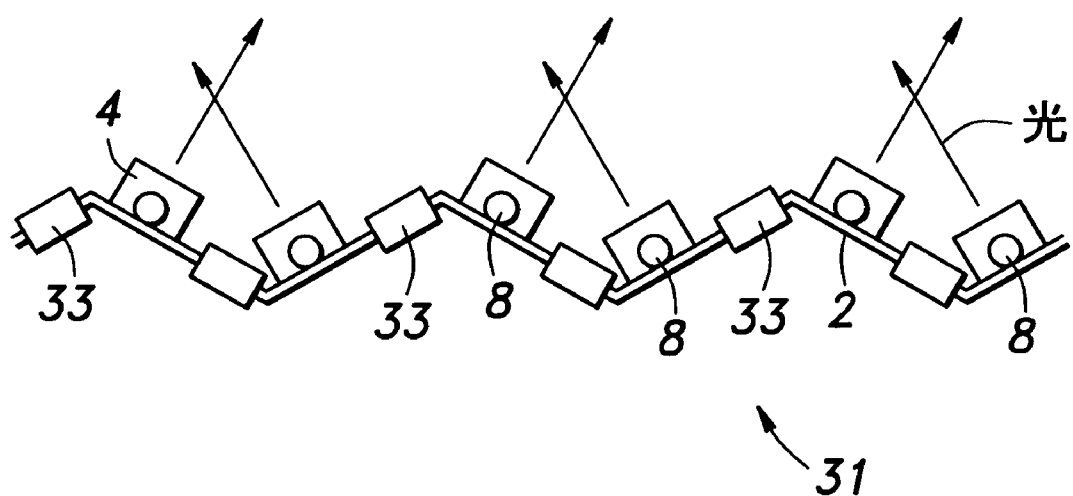

In this embodiment, each insulating joint member 33 has a narrower width at portions overlapping the conductors 32, and thus through-holes 35 for inserting bolts or the like therein to secure the light emitting module to a support member (not shown) are formed in portions corresponding to spaces between adjoining conductors 32. Further, portions of each conductor 32 other than those where the LEDs 6 are to be mounted are provided with a narrower width, and widthwise (or column-wise) extending holes 36 are formed in portions of each conductor 32 near the insulating joint members 33. These allow easier bending or cutting of the light emitting module 31 along a column-wise extending line connecting the holes 36. Because the light emitting module 31 can be easily bent, it is possible to arrange the light emitting module 31 so as to conform to a shape of the setting place or to vary the direction of lights emitted from the LEDs 6 to improve the freedom of illumination design. For example, as shown in the side view of FIG. 7a, it is possible to direct the lights from the LEDs 6 in an oblique direction with respect to the direction of extension of the light emitting module 31. Alternatively, as shown in the side view of FIG. 7b, the light emitting module 31 can be bent such that the lights from the LEDs 6 are directed in two different oblique directions with respect to the direction of extension of the light emitting module 31.

Figure 8A:
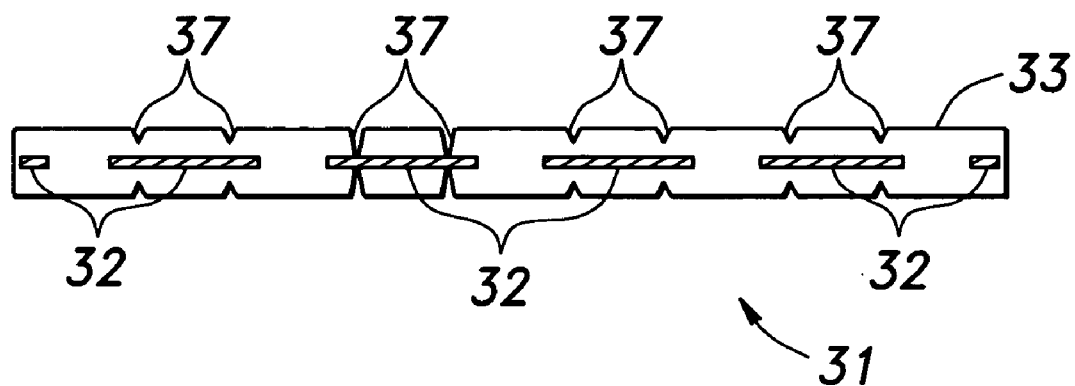
Figure 8B:
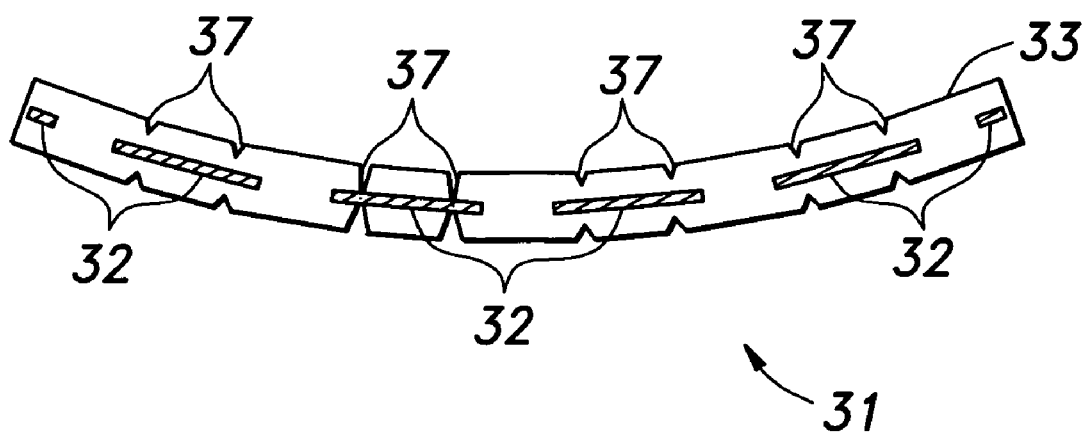
FIG. 8b is a view similar to FIG. 8a and shows the light emitting module in a flexed state.

FIG. 8a is a cross-sectional view taken along the line VIII—VIII of FIG. 6. As clearly shown in FIG. 8a, a plurality of row-wise extending grooves 37 having a depth of 0.2–0.4 mm, for example, are formed on both of upper and under sides of each insulating joint member 33 at prescribed column-wise positions. As shown in the set of grooves 37 second to the left in FIG. 8a, the grooves 37 may extend to the conductors 32. Further, as seen in FIG. 6, a plurality of row-wise extending holes 38 are formed in portions of the conductors 32 exposed between adjoining insulating joint members 33 at positions column-wise aligned with the grooves 37. In this way, as shown in FIG. 8b, the light emitting module 31 can be easily bent or flexed along lines connecting the grooves 37 and holes 38 in the row direction. This can also contribute to increasing the freedom of illumination design. Further, the light emitting module 31 can be cut easily along such a line.

Figure 9:
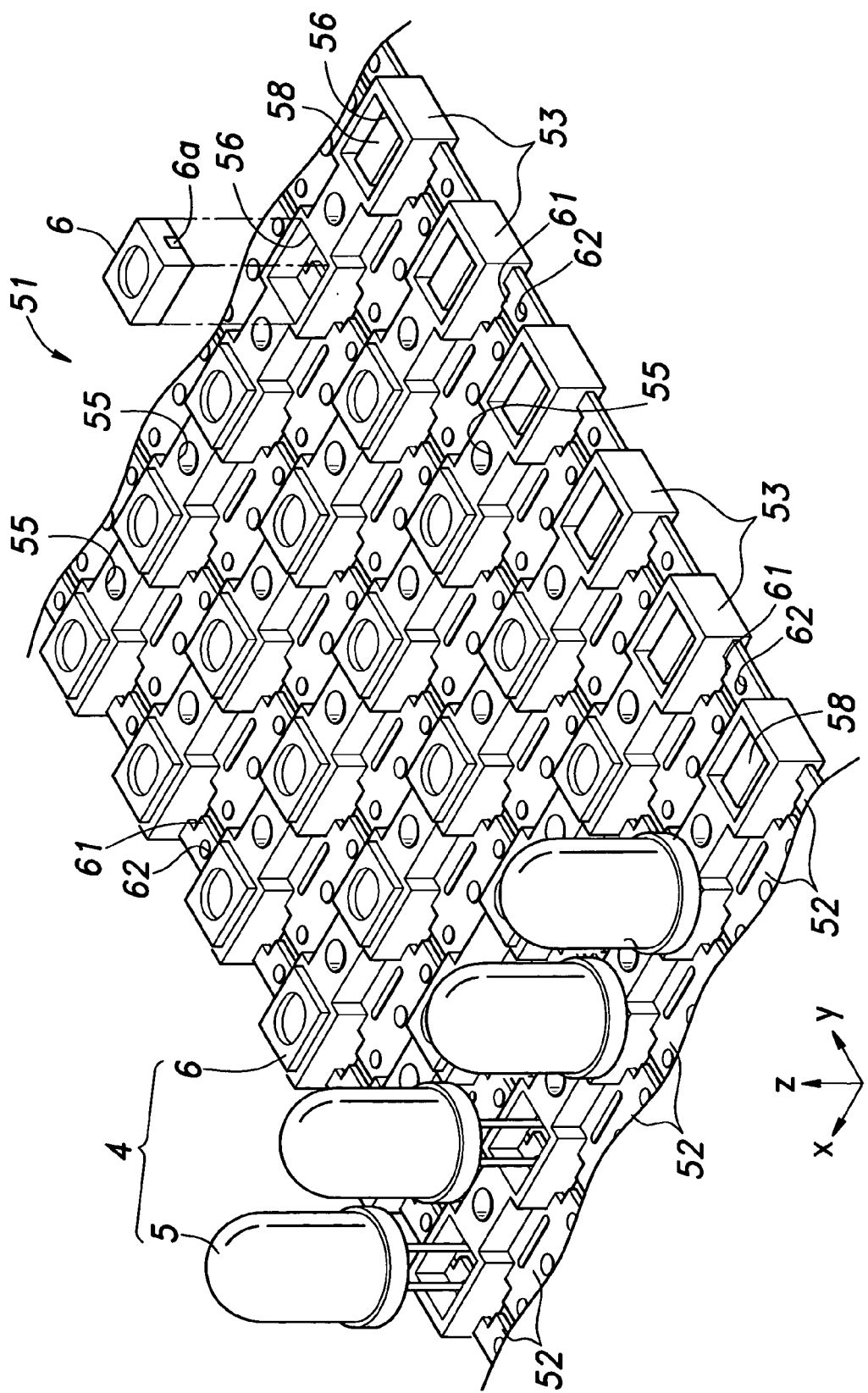
FIG. 9 is a partial perspective view showing another embodiment of a light emitting module according to the present invention.
Figure 10:
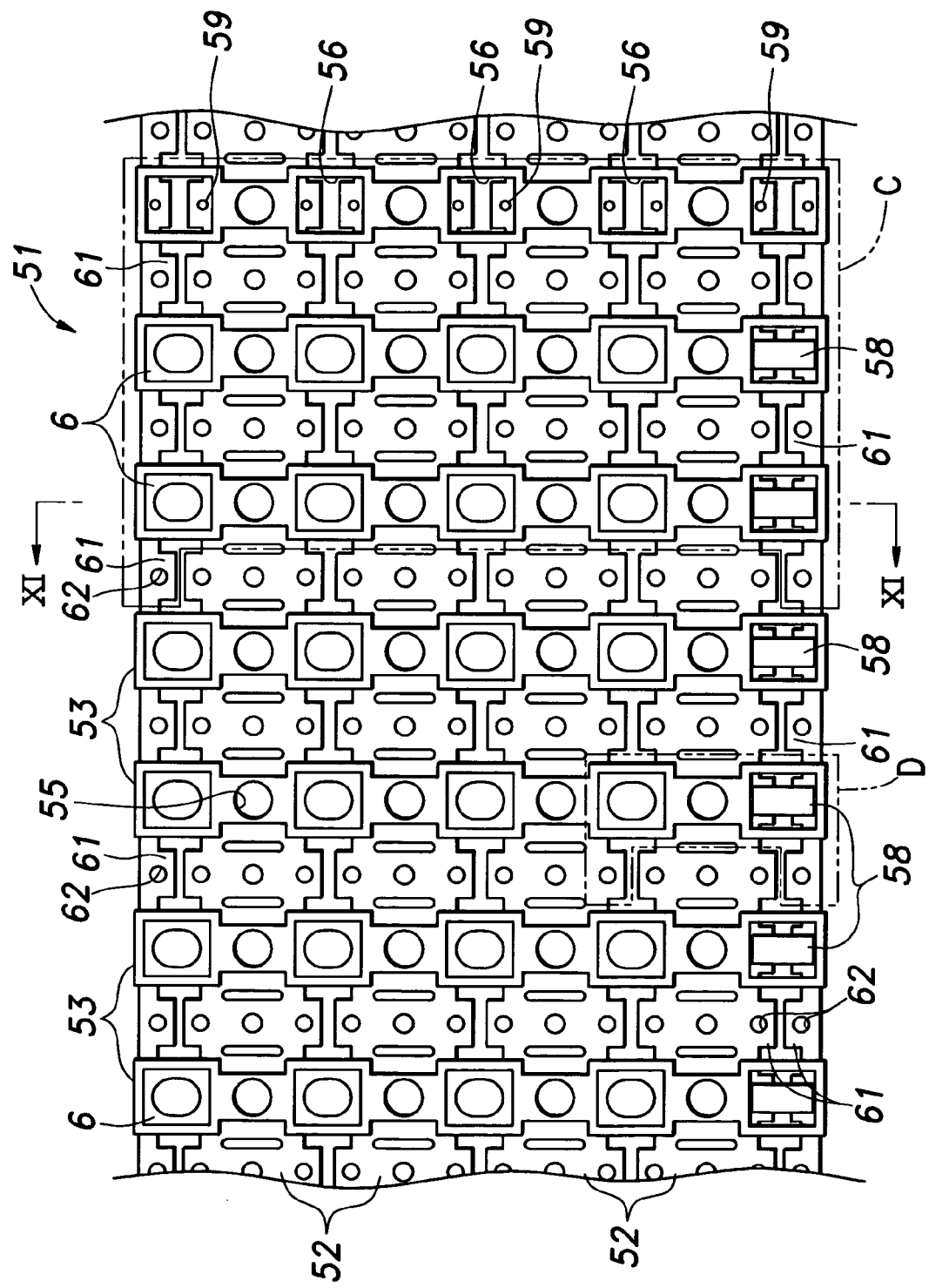
FIG. 10 is a partial plan view of the light emitting module shown in FIG. 9.
Figure 11:
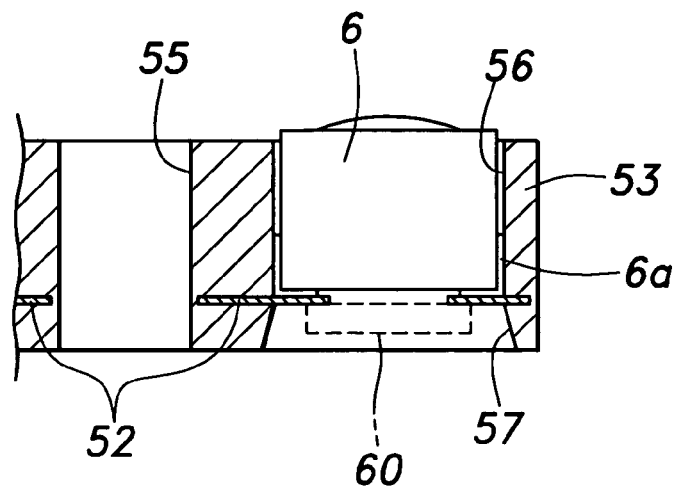
FIG. 11 is a partial cross-sectional view taken along the line XI—XI in FIG. 10.

FIG. 9 is a partial perspective view showing yet another embodiment of a light emitting module according to the present invention, FIG. 10 is a top plan view thereof, and FIG. 11 is a partial cross-sectional view taken along the line XI—XI of FIG. 10. It should be noted that FIG. 10 only shows chip-type LEDs 6 as light sources, and the right-end column shows a state where the chip-type LEDs 6 are yet to be mounted. Like the light emitting module 1 shown in FIG. 1, this light emitting module 51 also comprises: a plurality of conductors 52 spaced apart from each other in one direction; insulating joint members 53 for mechanically joining the conductors 52; and a plurality of LEDs 6 connected between adjoining conductors 52. Each insulating joint member 53 is formed with through-holes 55 through which bolts or the like for securing the light emitting module 51 to a support member are passed.

In this embodiment, an upper side of each insulating joint member 53 mechanically joining the conductors 52 is formed with openings 56, each of which has a rectangular shape when seen in the plan view and exposes an upper surface of an associated pair of adjoining conductors 52. This allows a chip-type LED 6, for example, to be inserted into the opening 56 so that the LED 6 is attached to the exposed parts of the conductors 52. Further, as best shown in FIG. 11, openings 57 are formed in the underside of each insulating joint member 53 such that they align with the openings 56 and communicate with the same. The openings 57 not only expedite dissipation of heat from the LEDs 6 but also allow laser to be passed therethrough so that the LEDs can be laser-welded to the conductors 52 easily. The walls of the insulating joint member 53 defining each lower openings 57 are tapered so that the opening 57 diverges in the direction away from the conductors 52 so that in the laser-welding process, the laser can be irradiated onto the conductors 52 easily from the underside through the opening 57. Each upper opening 56 may have dimensions that match those of the chip-type LED 6 so that the insulating joint members 53 having such openings 56 can serve as sockets for positioning or holding the chip-type LEDs 6. Further, as seen in the bullet-type LEDs 5 widthwise second and third to the right in FIG. 9, the upper surface of the insulating joint member 53 can abut an underside of the main body of the bullet-type LEDs 5 to prevent the leads 5a of the LEDs 5 from bending to cause the LEDs 5 to incline in the soldering process, for example. This favorably eliminates a need for an additional skirt member for preventing the inclination of the LED 5.

As best shown in the lowermost row in FIG. 10, instead of the LEDs 6, chip-type resistors 58 may be inserted into the openings 56 and attached to the conductors 52. Further, as shown in the rightmost column in FIG. 10, in order for permit attachment of elements having leads, such as the bullet-type LEDs 5 or resistors 8, portions of the pair of conductors 52 exposed by each opening 56 of the insulating joint member 53 are formed with holes 59 for receiving the leads 5a, 8a. The portions of the conductors 52 exposed by the openings 56, 57 of the insulating joint members 53 are each surrounded by an associated one of the insulating joint members 53, and thus are less deformable than the portions of the conductors 52 external of the insulating joint members 53. Therefore, attachment of the LEDs 5, 6 or resistors 8, 58 to the portions of the conductors 52 exposed by the openings 56, 57 can reduce the stress imposed upon the connections between such elements and the conductors 52.

Figure 12A:
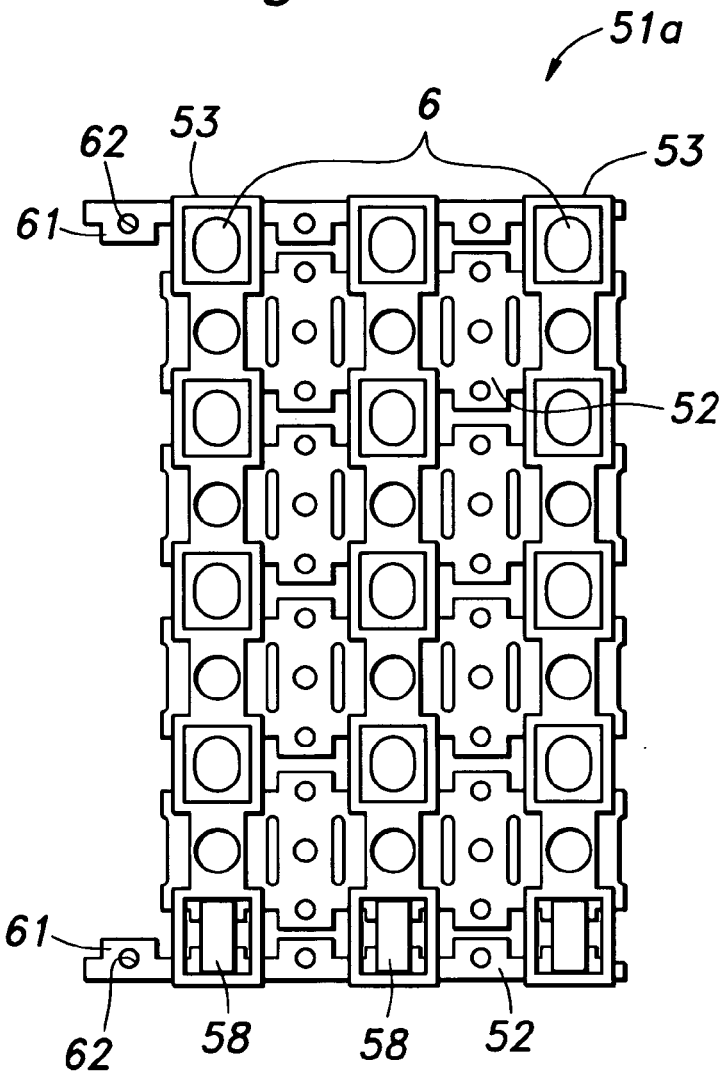
Figure 12B:
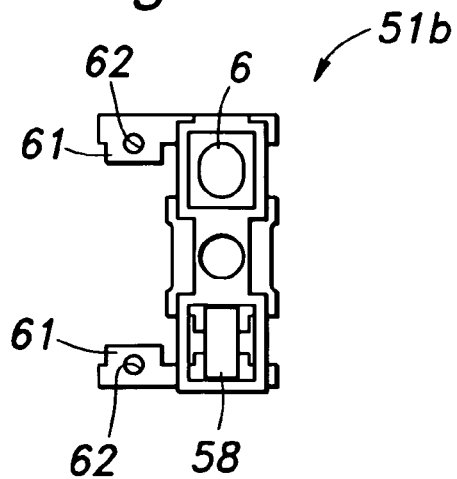
FIG. 12b is a plan view of a light emitting module formed by cutting the patterned conductor along the line D in FIG. 10.

Referring to FIG. 10 again, in the light emitting module 51, portions of each conductor 52 between adjoining insulating joint members 53 are each formed with column-wise extensions 61 where holes 62 are provided. In this way, if, after the attachment of the LEDs 6, the conductors 52 are cut along the line C in FIG. 10 for example, to form a light emitting module 51a having electric elements of five rows by three columns (among which, one row constitutes of resistors 58) as shown in FIG. 12a, the conductor portions including the extensions 61 and holes 62 can be used as connection terminals for facilitating connection to an external device such as a power supply. The holes 62 can allow conductive leads or the like for connection with the external device to be passed therethrough, to whereby allow easy connection. It is also possible to bend the extensions 61 so as to make crimp contacts for connecting to the lead wires of the external device. If the cutting is made along the line D in FIG. 10, a light emitting module 51b comprising a single LED 6 and a single resistor 58 which are connected in series as shown in FIG. 12b. In such a case also, the extensions 61 with the holes 62 can be used as connection terminals. As described above, by forming the holes 62 in the portions of the conductors 52 exposed between the adjoining insulating joint members 53, it is possible that when the light emitting module 51 is cut to form a light emitting module 51a, 51b containing a desired number of LEDs 6, proper conductor portions having the holes 62 may be left uncut such that the conductor portions may be used in the resulting light emitting module 51a, 51b as connection terminals for electrical connection to the external device. It should be noted that the extensions 61 may not be necessarily provided so long as there is enough space ensured for forming the holes 62. Further, though in the embodiment shown in the drawings, the conductors 52 at either end are formed with the extensions 61 only on one lateral side, the extensions may be formed on both lateral sides.

Figure 13:
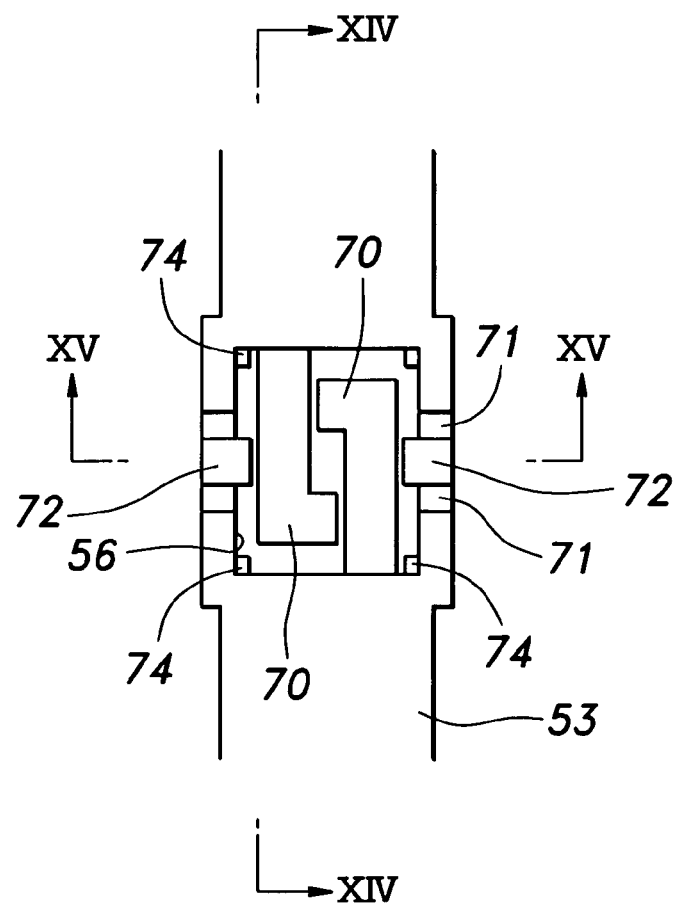
FIG. 13 is a partial plan view showing a modified embodiment of a light source mount portion of the light emitting module shown in FIG. 9.
Figure 14:
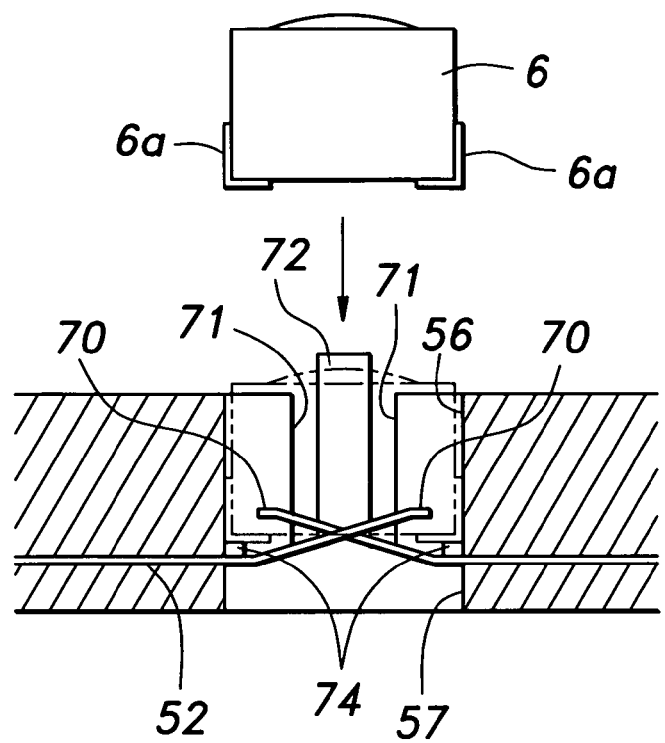
FIG. 14 is a partial cross-sectional view taken along the line XIV—XIV in FIG. 13.
Figure 15:
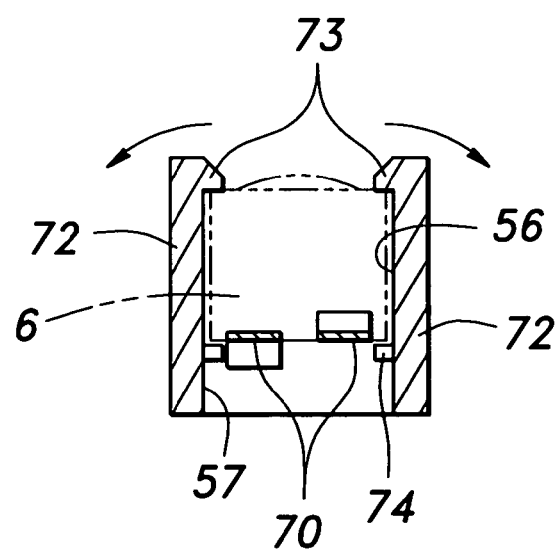
FIG. 15 is a partial cross-sectional view taken along the line XV—XV in FIG. 13.

FIG. 13 is a partial enlarged view showing another embodiment of the light source mount portion in the light emitting module 51 shown in FIGS. 9–12. FIG. 14 is a cross-sectional view taken along the line XIV—XIV of FIG. 13, and FIG. 15 is a cross-sectional view taken along the line XV—XV of FIG. 15. This embodiment is suitable for mounting the chip-type LEDs 6 having a substantially parallelepiped shape with no leads. FIG. 13 shows a state in which the LED 6 is yet to be mounted, and FIG. 15 shows the mounted LED 6 in phantom lines.

As shown in FIG. 13, in this embodiment, portions of the pair of conductors 52 exposed by the openings 56, 57 of the insulating joint member 53 for contacting the electric connection terminals 6a of the chip-type LED 6 have a pair of substantially parallel extensions 70 each of which extends to a vicinity of the opposing conductor 52, such that the extensions 70 can be bent in an upward direction to resiliently contact the terminals 6a on the underside of the chip-type LED 6. Each of the row-wise opposing pair of walls defining the upper opening 56 of the joint member 53 for receiving the chip-type LED 6 is formed with a pair of column-wise spaced slits 71 so that an upright engagement piece 72 is formed therebetween. The engagement pieces 72 can be flexed outwardly as shown by the arrows in FIG. 15 to facilitate the insertion of the chip-type LEDs 6 into the openings 56. An inward projection 73 is formed at a top end of each engagement piece 72 so that when the chip-type LED 6 is pushed into the opening 56, the inward projection 73 serves as a finger that presses the LED 6 from above to prevent inadvertent detachment of the LED 6 (see FIG. 15). In such a structure, it is possible by just pushing the chip-type LED 6 into the corresponding opening 56 to not only achieve quick mechanical attachment of the LED 6 but also achieve reliable electric contact between the LED 6 and the conductors 52 without using laser-welding or the like because the widthwise extensions 70 of the pair of conductors 52 resiliently contact the electric connection terminals 6a on the underside of the LED 6.

Further, at four corners of each opening 56 of the insulating joint members 53 slightly above the conductors 52, inward projections 74 are formed to limit the insertion of the chip-type LED 6 into the opening 56. This prevents a single electric connection. Terminal 6a of the LED 6 from contacting both of the pair of extensions 70.

Figure 16:
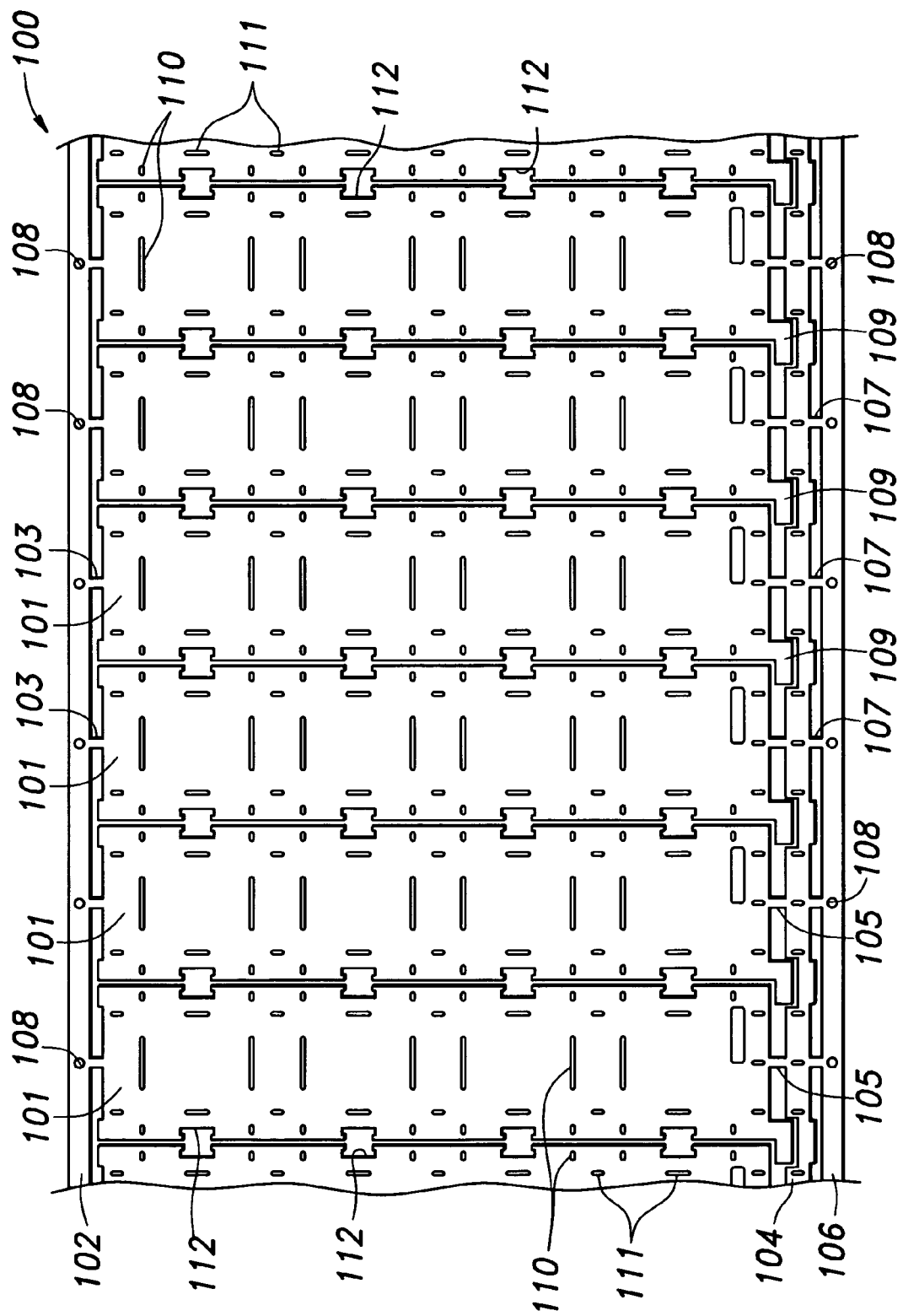
FIG. 16 is a partial plan view showing a patterned conductor which is used in another preferred embodiment of a method for manufacturing a light emitting module according to the present invention.
Figure 17:
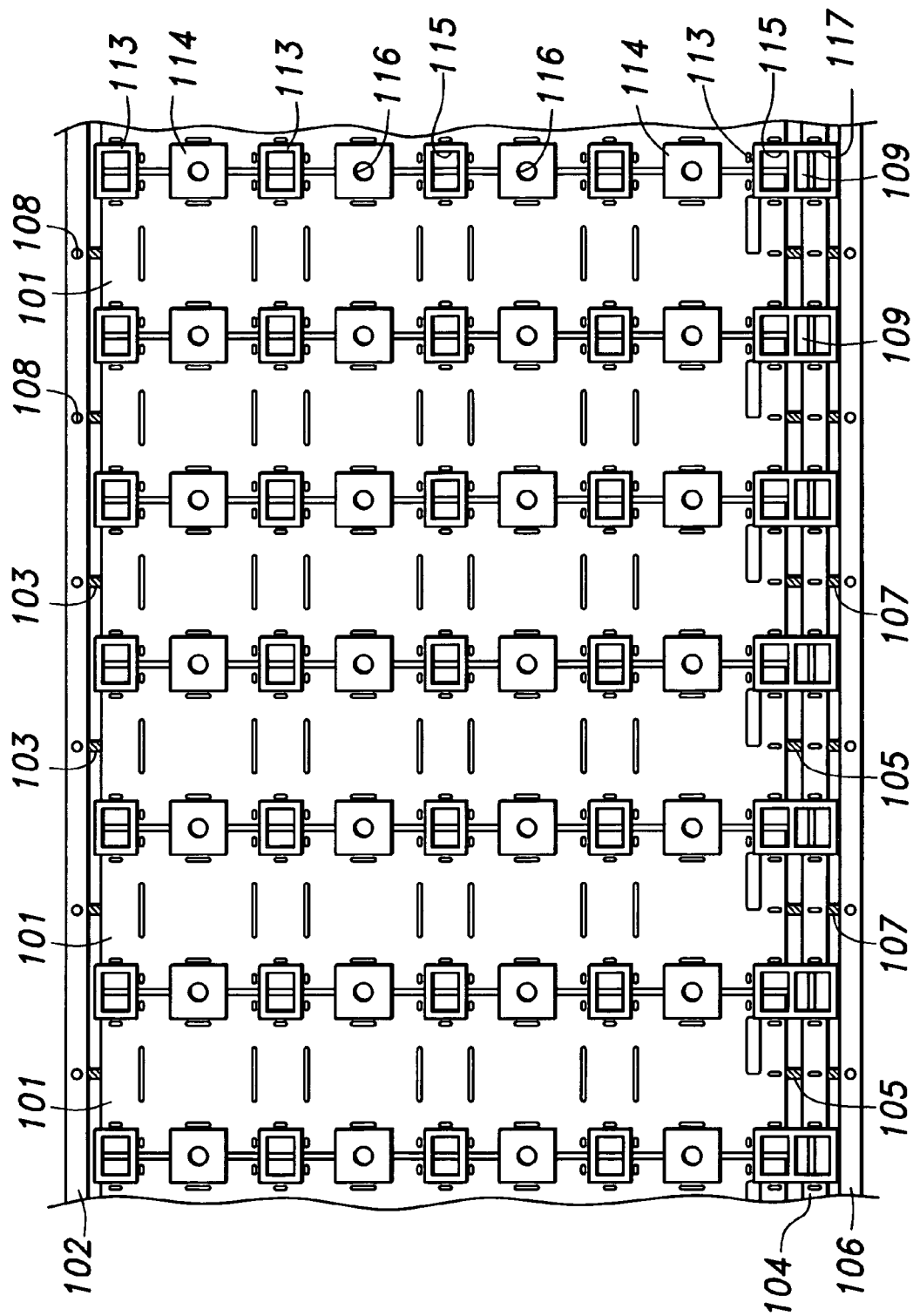
FIG. 17 is a partial plan view showing the patterned conductor of FIG. 16 attached with insulating joint members.
Figure 18:
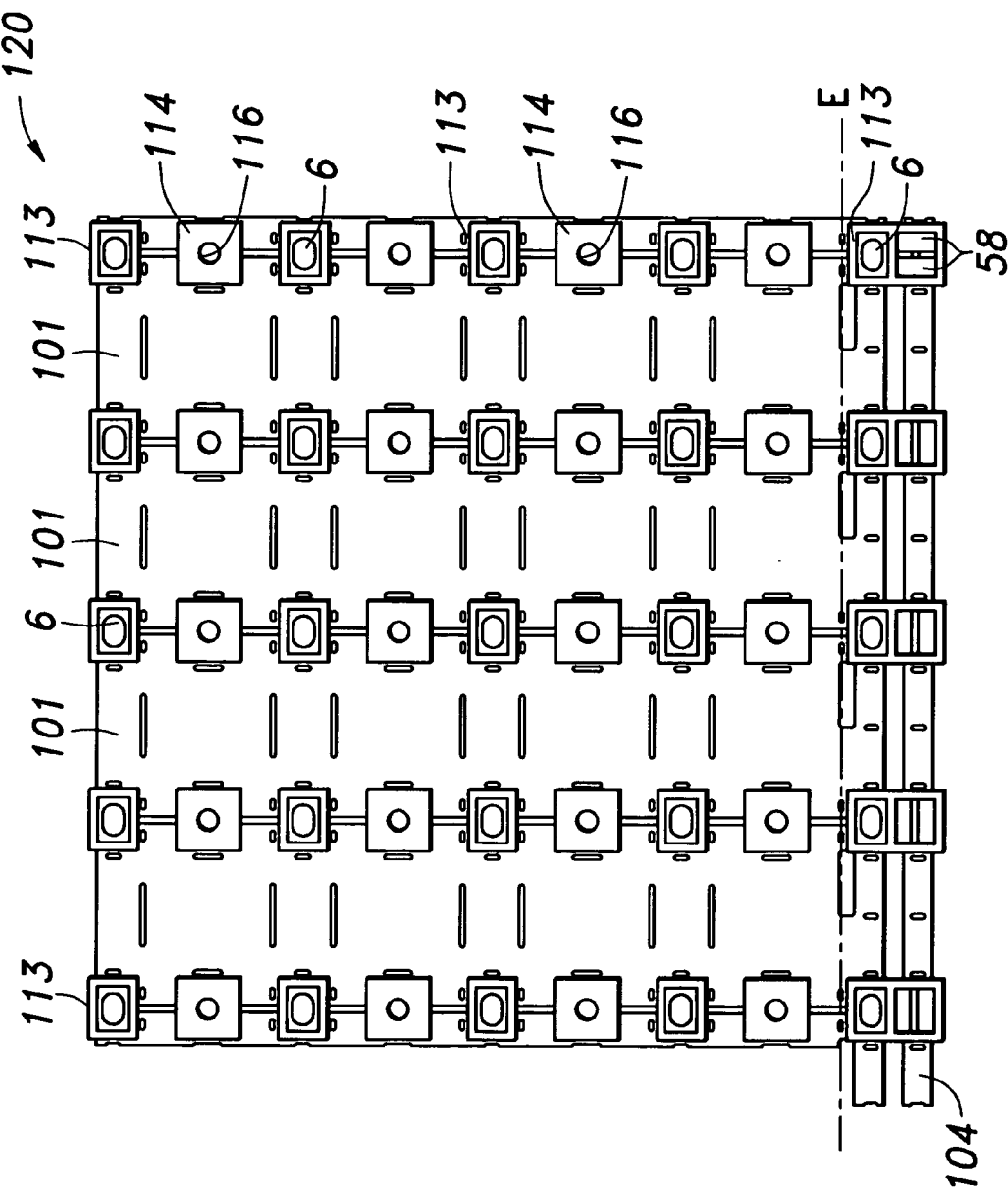
FIG. 18 is a plan view showing a light emitting module formed by using the patterned conductor shown in FIG. 16.

In the manufacturing process of the light emitting module 1 described with reference to FIGS. 2–4, the direction of transportation (or lengthwise direction) of the tape-shaped patterned conductor 20, in which the plurality of spaced-apart conductors 2 are integrally connected via connection pieces 21, was perpendicular to the direction in which the conductors 2 are spaced apart (or first direction) and thus coincided with the direction in which the conductors 2 extend (or second direction). Therefore, the number of light sources such as LEDs 6 parallel-connected between adjoining conductors 2 could be arbitrarily selected but the number of light sources (or light source parallel connections) to be connected in series was limited (the maximum number was (number of conductors 2)-1, when no resistors are connected). However, it may be sometimes desirable that the number of light sources to be connected in series can be selected arbitrarily in accordance with various power supply voltages. FIGS. 16–18 show an embodiment of a method for manufacturing a light emitting module according to the present invention that allows arbitrary selection of the number of light sources to be connected in series.

First, a patterned conductor 100 as shown in FIG. 16 is prepared. The patterned conductor 100 is transported from left to right in the drawing. The patterned conductor 100 comprises a plurality of conductors 101 which are spaced apart from each other in a direction of transportation of the patterned conductor 100, and each of the conductors 101 extends in a direction perpendicular to the transportation of the patterned conductor 100. Therefore, in this embodiment, the first direction in which the conductors 100 are spaced apart from each other coincides with the direction of transportation of the patterned conductor 100 while the second direction in which the conductors 100 extend is perpendicular to the direction of transportation of the patterned conductor 100. One end (upper end in the drawing) of each conductor 101 is connected via a connection piece 103 to a first side frame 102 that extends in the direction of transportation of the patterned conductor 100. The other end of each conductor 101 is connected via a connection piece 105 to a power supply connection bar 104 extending in the direction of transportation of the patterned conductor 100. The power supply connection bar 104 is in turn connected via connection pieces 107 to a second side frame 106, which also extends in the direction of transportation of the patterned conductor 100. The first and second side frames 102, 106 are formed with pilot holes 108 so as to be engageable with pilot pins of a progressive manufacturing line (not shown) to achieve transportation of the patterned conductor 100. Further, the other end (or lower end in the drawing) of each conductor 101 has an extension 109 that extends to a position substantially aligned with a space between adjoining conductors 101 such that resistors or the like can be mounted between the extension 109 and the power supply connection bar 104 as described later.

The patterned conductor 100 is also provided with holes or grooves 110 which are aligned in the first direction as well as holes or grooves 111 which are aligned in the second direction for permitting easy cutting of the patterned conductor 100 and/or easy bending of a light emitting module 120 (FIG. 18) to be formed.

Next, as shown in FIG. 17, a plurality of insulating joint members 113, 114 are formed by molding to join adjoining conductors 101 to each other. In this embodiment, first joint members 113 having an opening 15 for receiving the light source therein and second joint members 114 formed with a through-hole 116 through which a bolt or the like is passed to secure the resulting light emitting module 120 (FIG. 18) to a support member or the like are arranged alternately in a direction perpendicular to the direction of transportation of the patterned conductor 100 (i.e., in a direction of extension of the conductors 101) along a gap between adjoining conductors 101. It may be also possible to integrally form the first and second joint members 113, 114 which are aligned in the direction of extension of the conductors 101, but making them spaced apart from each other as shown in the drawing not only can save the amount of material and thereby reduce the manufacturing cost but also can facilitate bending the conductors 101 at a point between the joint members 113, 114 or cutting the conductors 101 to form a light emitting module of a desired size.

Referring to FIG. 16 again, portions of each conductor 101 where the second joint members 114 are provided are formed with recesses 112 each having portions widening in the first and second directions. The second joint members 114 extend through the recesses 112 in the thickness direction of the conductors 101 and therefore the second joint member 114 and the conductors 101 are joined firmly to prevent shift therebetween in both the first and second directions. Further, owing to the provision of the recesses 112, the conductors 101 are not exposed within the through-holes 116 formed in the second joint members 114.

As shown in FIG. 17, the first and second joint members 113, 114 are also spaced apart in the direction of transportation of the patterned conductor 100 (or in the first direction in this embodiment) to expose the conductors therebetween. This can allow heat dissipation from the exposed parts of the conductors 101 as well as easy bending or flexion of the conductors 101 at such exposed parts. Though not shown in the drawings, each first joint member 113 has lower openings as in the embodiment shown in FIGS. 9–11, whereby both the upper and under sides of the conductors 101 are exposed within the first joint member 113.

The joint members 113 at the lowermost row in FIG. 17 not only join adjoining conductors 101 to each other but also join the power supply connection bar 104 to the conductors 101. These joint members 113 each comprise, in addition to the opening 115 for exposing portions of the conductors 101 where the LED is to be mounted, an opening 117 for exposing the extension 109 of the conductor 101 and a portion of the power supply connection bar 104 so that a resistor can be attached thereto. Because the extension 109 substantially extends to a point between the adjoining conductors 101, the opening 115 for receiving the LED and the opening 117 for receiving the resistor can be aligned in the first direction (or the direction in which the conductors 101 are spaced apart) and brought as close to each other as possible such that the openings 115, 117 are efficiently formed in the same insulating joint member 113.

After forming the joint members 113, 114 by molding, the connection pieces 103, 105, 107 are cut off as indicated by hatching in FIG. 17. This electrically separates adjoining conductors 101 from each other but the joint members 113, 114 hold the conductors 101 together.

Then, as shown in FIG. 18, light sources such as the chip-type LEDs 6 are inserted into the openings 115 of the first joint members 113 to mount them on the conductors 101, and a conductor 101 at an appropriate position is cut to form a light emitting module 120 comprising a desired number (five in the shown embodiment) of light source parallel connections, each of which has a plurality (five in the shown embodiment) of parallel-connected light sources, where the light source parallel connections are connected in series in the direction of transportation of the patterned conductor 100. It should be noted that by changing the position to cut the conductor 101, the number of light source parallel-connections that are connected in series can be arbitrarily selected.

As shown in FIG. 18, on one end in the first direction (right end in the drawing) of the resulting light emitting module 120, two chip-type resistors 58 are inserted into the opening 117 of the lowermost joint member 113 to electrically connect the extension 109 of the conductor 101 and the power source connection bar 104. In this way, it is possible to connect a power supply to the conductor 101 and the power supply connection bar 104 on the other end (the left end in the drawing) to supply electric power to the light emitting module 120. Thus, the provision of the power supply connection bar 104 extending in the first direction can easily make a light emitting module 120 that can be supplied with electric power at its one end.

Figure 19:
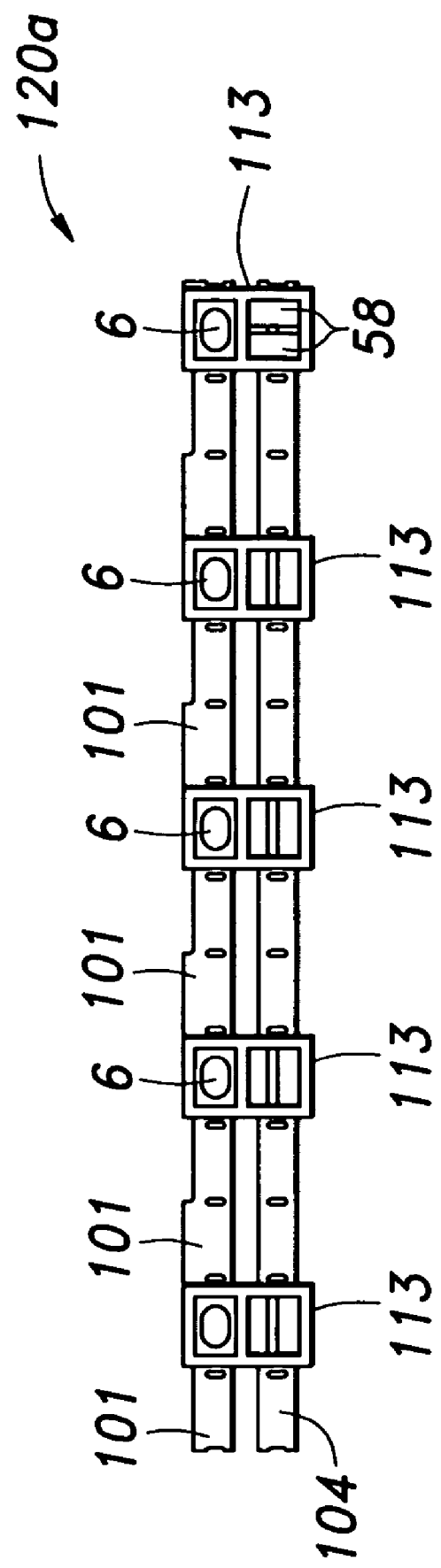
FIG. 19 is a plan view showing a light emitting module formed by cutting the conductor along the line E in FIG. 18.

In the above embodiment, it is possible to arbitrarily change the number of light source parallel-connections that are connected in series in accordance with an amount of voltage of a power supply or the like so that the light emitting module 120 can be directly connected to the power supply while suppressing the amount of electric power wastefully consumed by the resistors 58. Further, by cutting the light emitting module 120 along the line E in FIG. 18, it is possible to obtain a light emitting module 120a comprising only one row of series-connected LEDs 6 as shown in FIG. 19. It is also possible to form the light emitting module 120a by preparing another patterned conductor having a shape as obtained by cutting the patterned conductor 100 along the line E, and then performing the molding and LED mounting in the same way as described above.

It may be possible to omit the first joint members 113 in the above embodiment. However, as described above with respect to the embodiment shown in FIGS. 9–12, attaching the light sources to the conductors 101 within the openings 115 of the first joint members 113 can contribute keeping stress from being placed upon connections between the light sources and the conductors 101. Further, when the through-holes 116 for passing bolts or the like therethrough for attaching the light emitting module to a support member are not needed, the second joint members 114 may be omitted. In such a case, however, in order to improve the strength of joint between the first joint members 113 and the conductors 101, the conductors 101 can be preferably formed with holes such that the first joint members 113 can extend therethrough in the direction of thickness of the conductors 101.

Figure 20A:
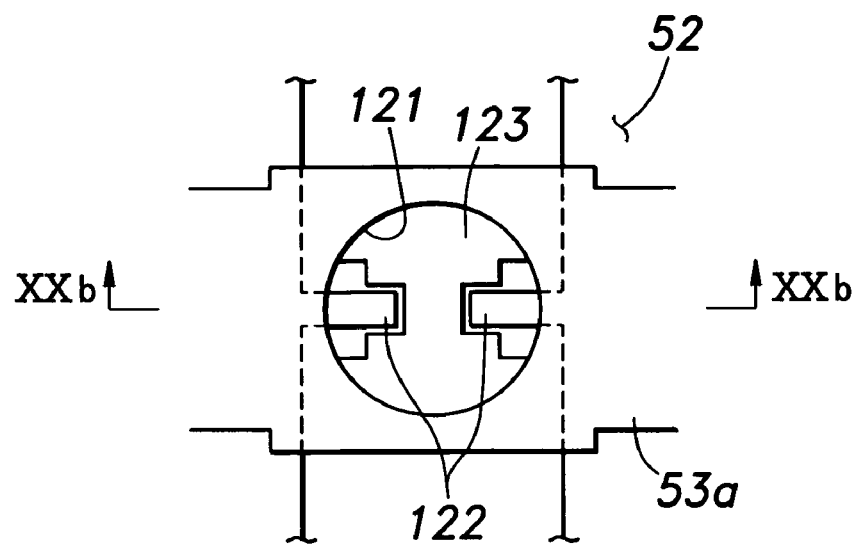
FIG. 20a is a partial plan view showing a light source mount structure suitable for a bullet-type LED.
Figure 20B:
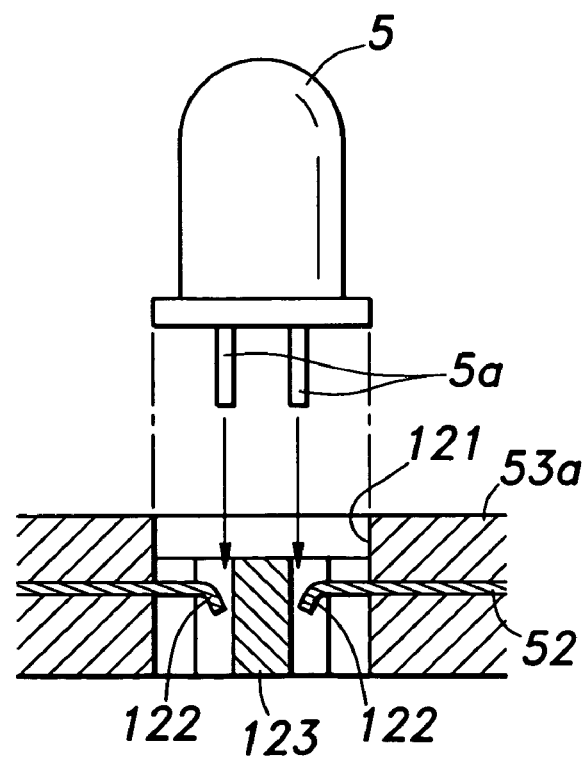

FIGS. 13–15 have shown a preferred embodiment suitable for inserting the chip-type LEDs into the openings 56 formed in the insulating joint members 53 to connect them to the conductors 52, but LEDs may include bullet-type LEDs 5 having leads 5a. FIGS. 20a and 20b show an embodiment suitable for the bullet-type LEDs.

FIG. 20a is a plan view showing an LED mount portion and FIG. 20b is a cross-sectional view taken along the line XXb—XXb in FIG. 20a. It should be noted that in FIG. 20a, the direction of the LED mount portion is rotated by 90 degrees with respect to FIG. 13. As shown, in this embodiment, an insulating joint member 53a joining the conductors 52 has an opening 121 at a position between the pair of conductors 52 to which the bullet-type LED 5 is to be connected, where the opening 121 is circular so as to conform to the shape of the bullet-type LED 5. The insulating joint member 53a further comprises a partition wall 123 extending across the opening 121 in a direction of extension of the conductors 52. Each of the pair of conductors 52 to which the bullet-type LED 5 is to be connected has an extension 122 that extends out toward the partition wall 123 so as to be exposed within the opening 121.

As best shown in FIG. 20b, before the bullet-type LED is mounted, an end portion of each extension 122 of the conductors 52 is curved downward to form a small gap between the end portion and the partition wall 123. Preferably the gap is smaller than the lead 5a of the bullet-type LED 5. The end portion of the extension 122 may contact the partition wall 123. In this way, by pushing the leads 5a of the bullet-type LED 5 into the gaps between the extensions 122 and the partition wall 123, the leads 5a are cramped between the extensions 122 and the partition wall 123. Due to the resiliency of the extensions 122, the extensions 122 press the leads 5a against the partition wall 123, thus achieving reliable contact between the extensions 122 and the leads 5a. The downward curve of the end portion of each extension 122 allows the lead 5a to be pushed into the gap easily but when the lead 5a is being pulled out, a frictional force is generated between the lead 5a and the extension 122. Thus, without laser-welding or the like, the LED 5 can be held firmly and prevented from easily coming out of place. Further, because the shape (dimensions) of the opening 121 is determined so as to conform to that of the bullet-type LED 5, when the LED 5 is inserted into the opening 121, the wall of the insulating joint member 53a defining the opening 121 serves to hold the LED 5. The partition wall 123 abuts the underside of the LED 5 to limit the insertion of the LED 5 into the opening 121. Because the laser-welding is unnecessary, the opening 121 may not have to extend to the underside of the insulating joint member 53a to expose the underside of the extensions 122 of the conductors 52 although in view of heat dissipation, it is preferred that the underside of the extensions 122 is exposed.

Figure 21:
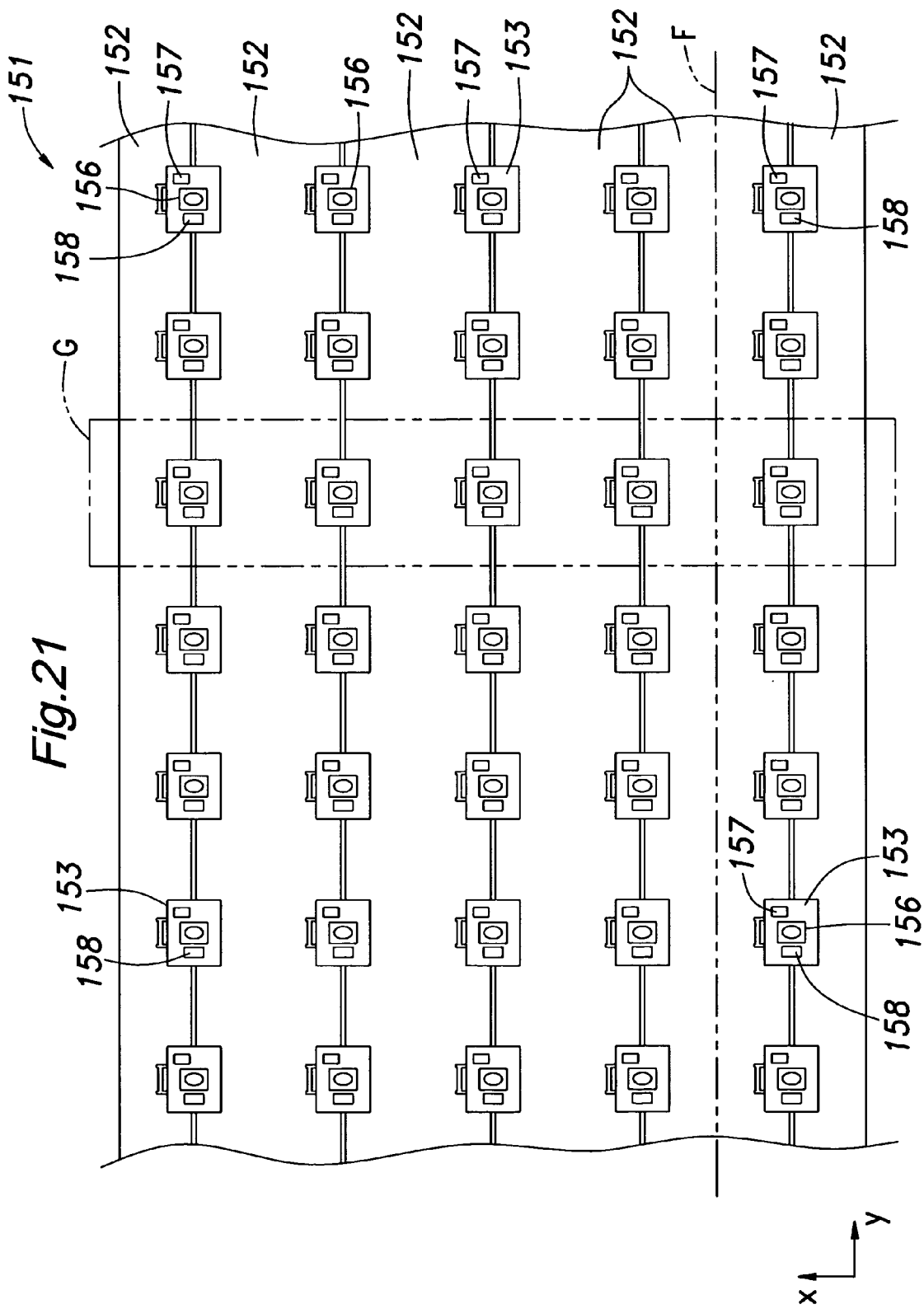
FIG. 21 is a partial plan view showing another embodiment of a light emitting module according to the present invention.

FIG. 21 is a partial plan view showing another embodiment of a light emitting module according to the present invention. As in the above embodiments, this light emitting module 151 comprises: a plurality (six in this embodiment) of thin plate-shaped conductors 152 spaced apart from each other in a first direction (or x-axis direction) and extending in a second direction (or y-axis direction) substantially perpendicular to the first direction; a plurality of insulating joint members 153 for mechanically joining the conductors 152; and a plurality of chip-type LEDs 156 connected between adjoining conductors 152 to serve as light sources. The LEDs 156 are arranged in a matrix pattern with predetermined intervals in the first and second directions. In this embodiment, a resistor 157 and a zener diode 158 are provided for each LED 156. The insulating joint members 153 are provided so as to correspond to individual LEDs 156, and each insulating joint member 153 is formed with three openings 173, 174, 175 for accommodating the LED 156, resistor 157 and zener diode 158, respectively (see FIG. 25). Such insulating joint members 153 can be preferably formed by molding.

Figure 22:
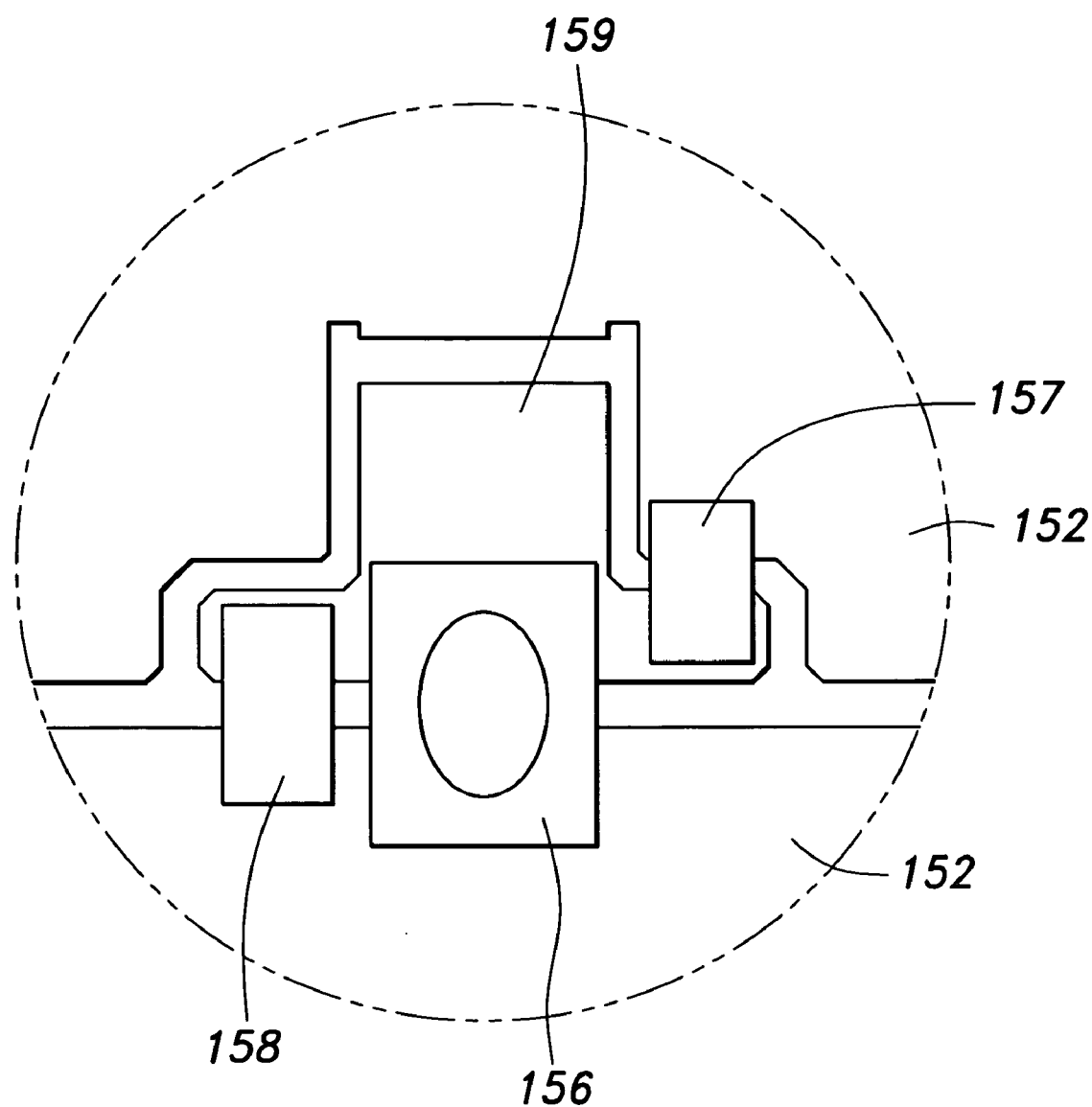
FIG. 22 is a partial enlarged view showing the light emitting module of FIG. 21 with the joint member being omitted.

FIG. 22 is an enlarged top plan view showing a way of attachment of a single LED 156 and its associated resistor 157 and zener diode 158 between adjoining conductors 152, with the insulating joint member 153 being omitted. As shown, a conductive piece 159 is provided between the adjoining conductors 152. The LED 156 and the zener diode 158 are connected in parallel between the conductive piece 159 and one conductor 152, while the resistor 157 is connected between the conductive piece 159 and the other conductor 152. Therefore, the LED 156 and the resistor 157 are connected in series between the adjoining conductors 152. The zener diode 158 connected in parallel with the LED 156 functions to prevent an overvoltage from being applied to the LED 156. A resistance of the resistor 157 connected in series to the LED 156 is selected depending on the characteristics of the LED 156 such that when a predetermined voltage (e.g., 4V) is applied between the adjoining conductors 152, a predetermined rated current flows through the LED 156. In this way, the light emitting module 151 can comprise a plurality of LEDs 156 having different characteristics.

Figure 23A:
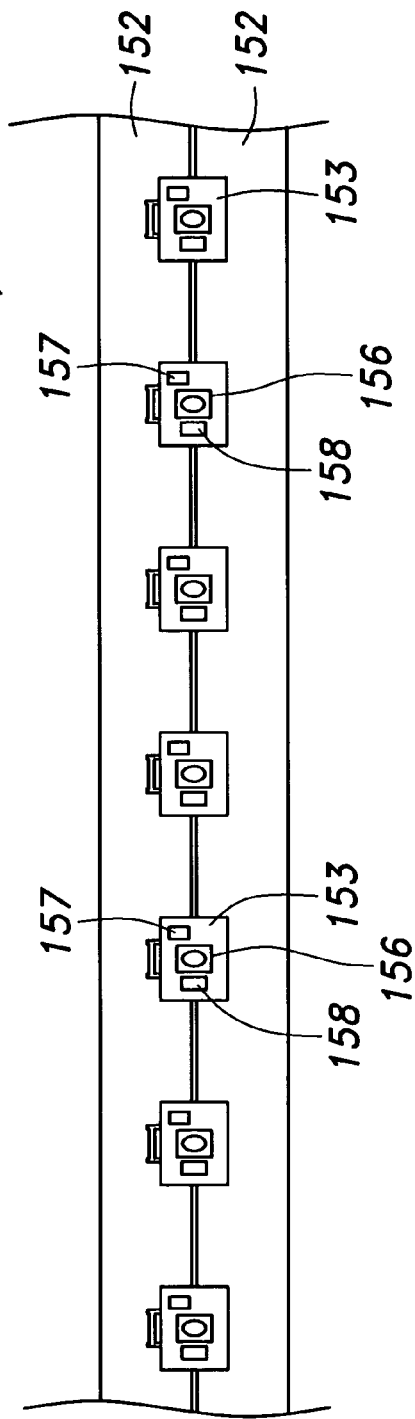
Figure 23B:
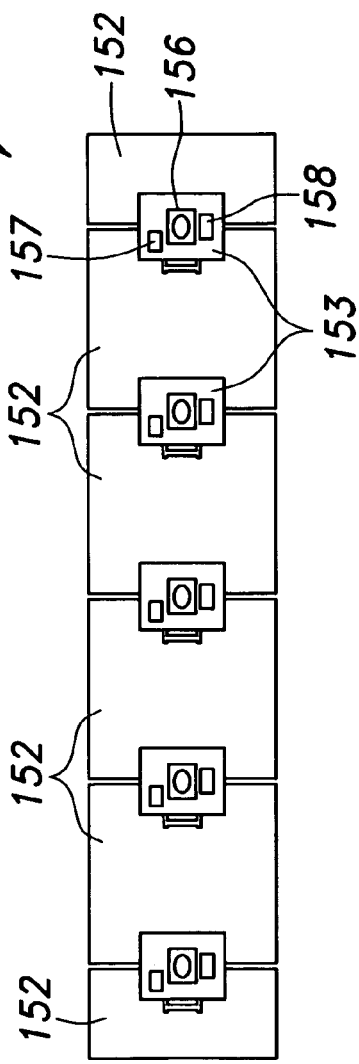
FIG. 23b is a plan view of a light emitting module formed by cutting the conductor along the line G in FIG. 22.

The light emitting module 151 having the LEDs 156 arranged in a matrix pattern as shown in FIG. 21 can be cut at appropriate portions to form a smaller light emitting module comprising the LEDs 156 in an arbitrary rows and columns. For example, by cutting the light emitting module 151 along the line F in FIG. 21, a light emitting module 151a comprising an arbitrary number of parallel-connected LEDs 156 as shown in FIG. 23a can be provided. Alternatively, by cutting the light emitting module 151 along the line G in FIG. 21, a light emitting module 151b comprising five series-connected LEDs 156 as shown in FIG. 23b can be formed. Because in the light emitting module 151 each LED 6 is connected in series with a resistor having an appropriate resistance as described above, a smaller light emitting module obtained by cutting the light emitting module 151 automatically comprises resistors having appropriate resistances suitable for the LEDs 156 contained therein irrespective of the position where the cutting is done, and thus there is no need to provide additional outer resistors. Thus, it is easy for a user to cut the light emitting module 151 as desired to form smaller lighting modules, and arrange them in various patterns. As in the embodiments described above, in the light emitting module 151 also, the mechanical joint of the conductors 152 is achieved by the insulating joint members 153, and thus it is possible to keep stress from being placed upon electric connections between the conductors 152 and the LEDs 156.

Figure 24:
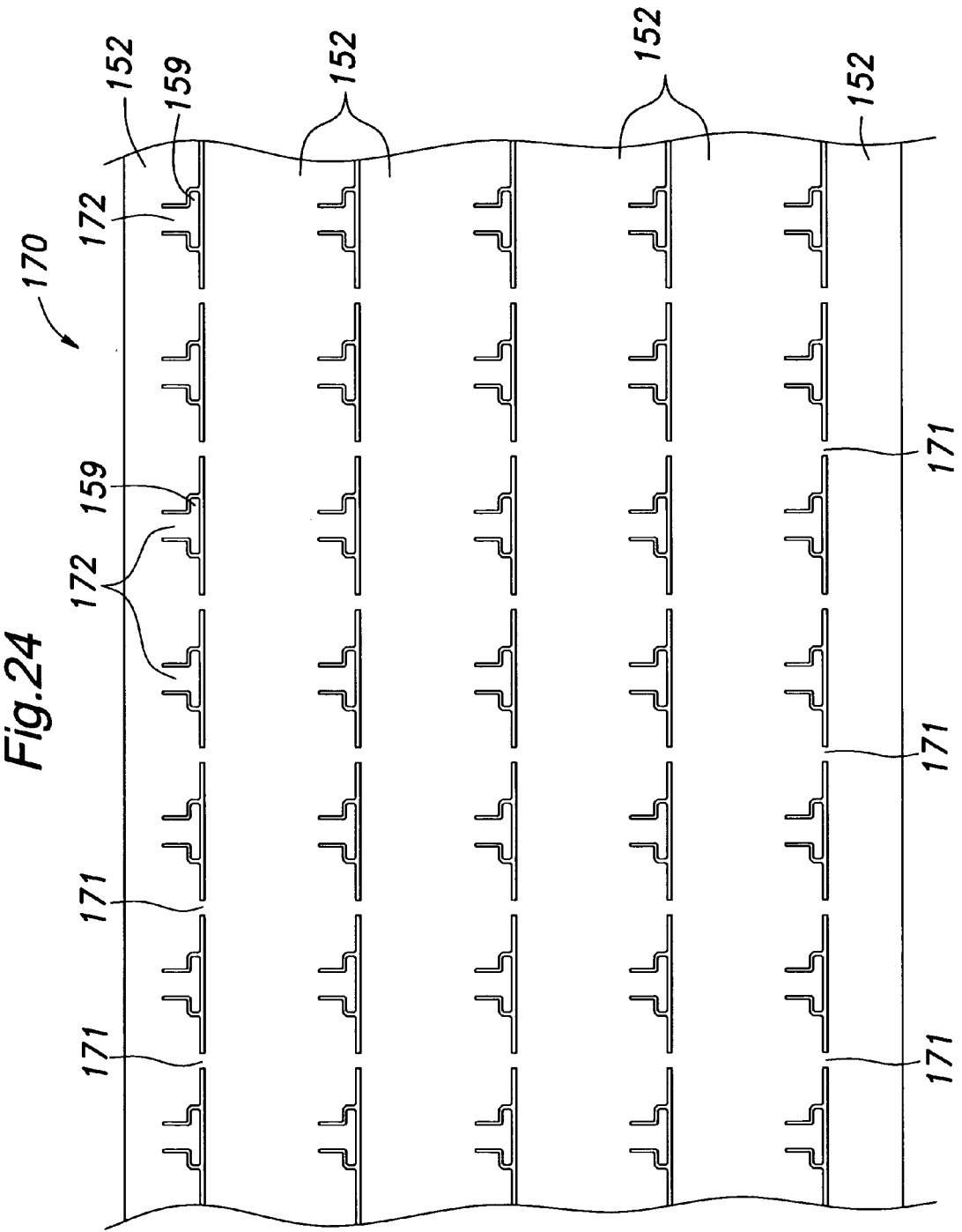
FIG. 24 is a partial plan view showing a patterned conductor suitable for forming the light emitting module shown in FIG. 21.

FIG. 24 is a plan view showing a patterned conductor 170 suitable for forming the light emitting module 151 shown in FIG. 21. As shown, in this patterned conductor 170, adjoining conductors 152 are connected to each other via a plurality of connection pieces 171. Further, the conductive pieces 159 located between adjoining conductors 152 are connected to one of the adjoining conductors 152 via connection pieces 172. Such a patterned conductor 170 can be formed easily by press-working a thin plate-shaped conductor such as a metal.

Figure 25:
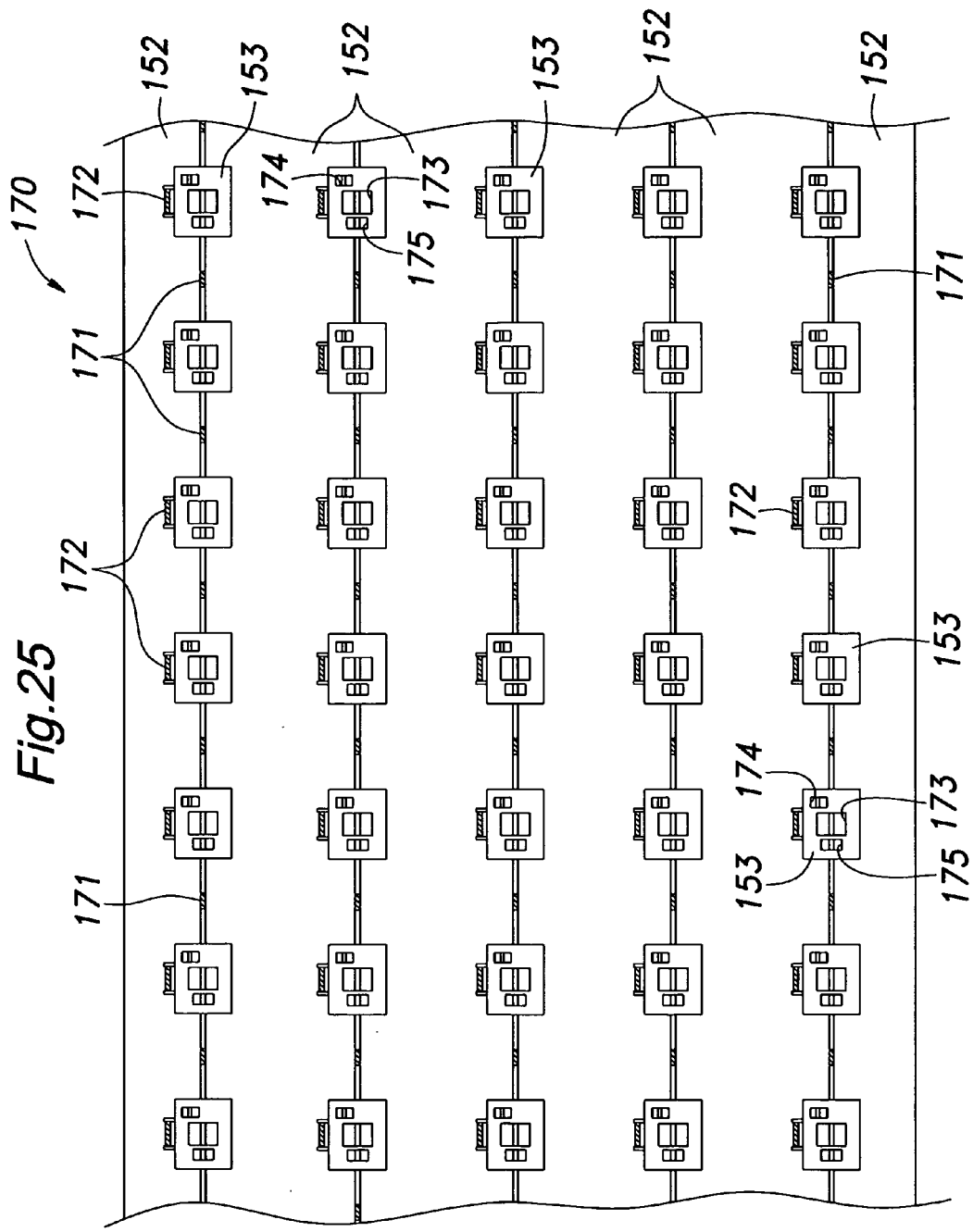
FIG. 25 is a partial plan view showing the patterned conductor of FIG. 24 attached with joint members.

As shown in FIG. 25, after forming the insulating joint members 153 by molding to hold adjoining conductors 152 together, the connection pieces 171, 172 are cut off as indicated by hatching in the drawing. Each insulating joint member 153 has openings 173, 174, 175 for receiving the associated LED 156, resistor 157 and zener diode 158, and the openings 173, 174, 175 expose portions of the conductors 152 and conductive piece 159. Subsequently, the LED 156, resistor 157 and zener diode 158 are inserted into the openings 175, 174, 175 of each insulating joint member 153 and attached to the conductors 152 and conductive piece 159 by laser welding, spot welding, soldering or the like to form the light emitting module 151.

Figure 26:
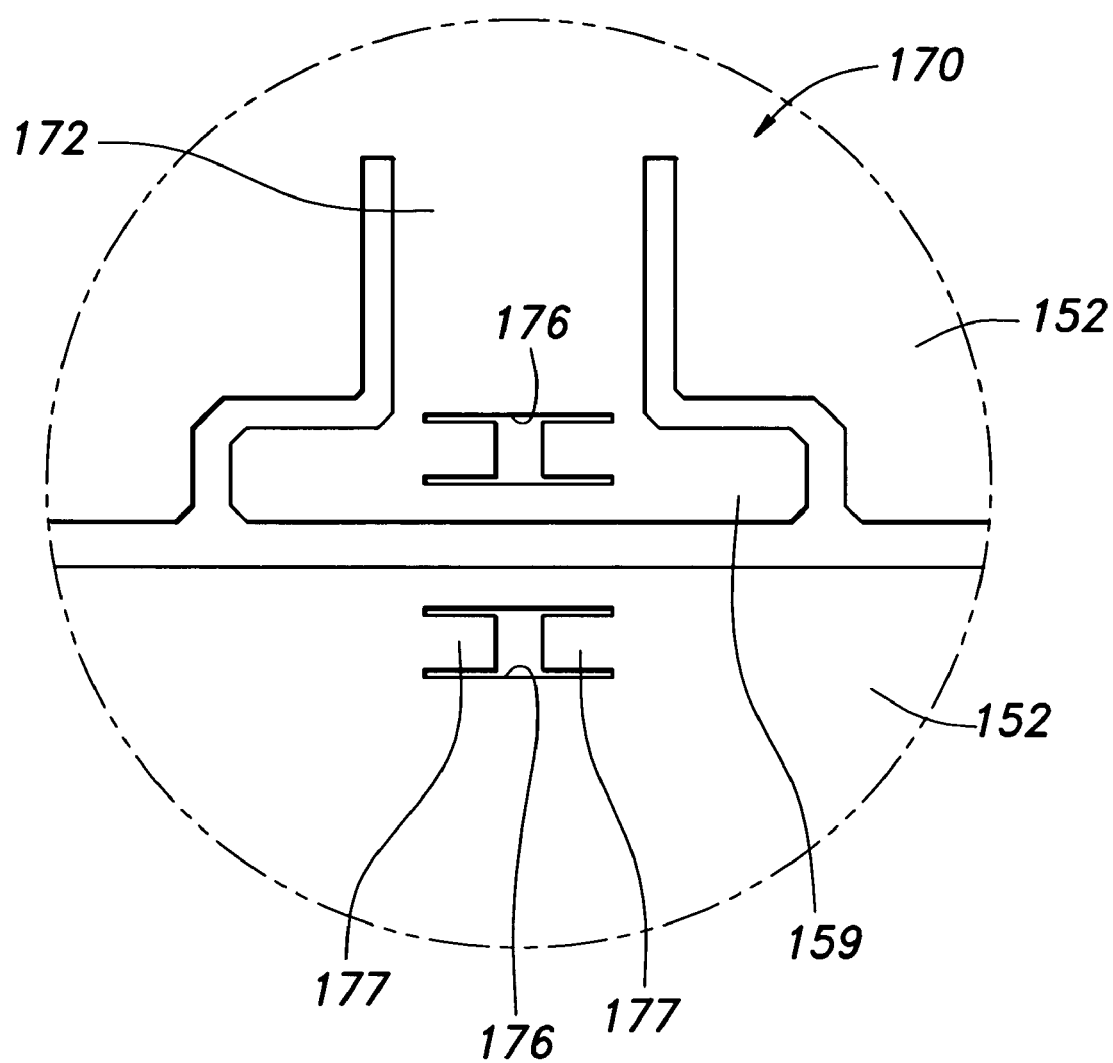
FIG. 26 is a partial enlarged plan view showing another embodiment of a light source mount portion of the patterned conductor shown in FIG. 24.

The light emitting module 151 of FIG. 21 uses the chip-type LEDs 156 as light sources, but it is preferable that bullet-type LEDs having leads (e.g., the LED 5 in FIG. 1) can be also used as light sources. For this reason, as shown in an enlarged partial view of FIG. 26, the light source mount portions of the patterned conductor 170 may be formed with holes 176 for receiving and holding the leads 5a of the LEDs 5. As shown, each hole 176 is formed as an H-shaped cut to define a pair of opposed extensions 177, 177 so that when the lead 5a is inserted between the extensions 177, 177, they flex to crimp the lead therebetween.

Figure 27:
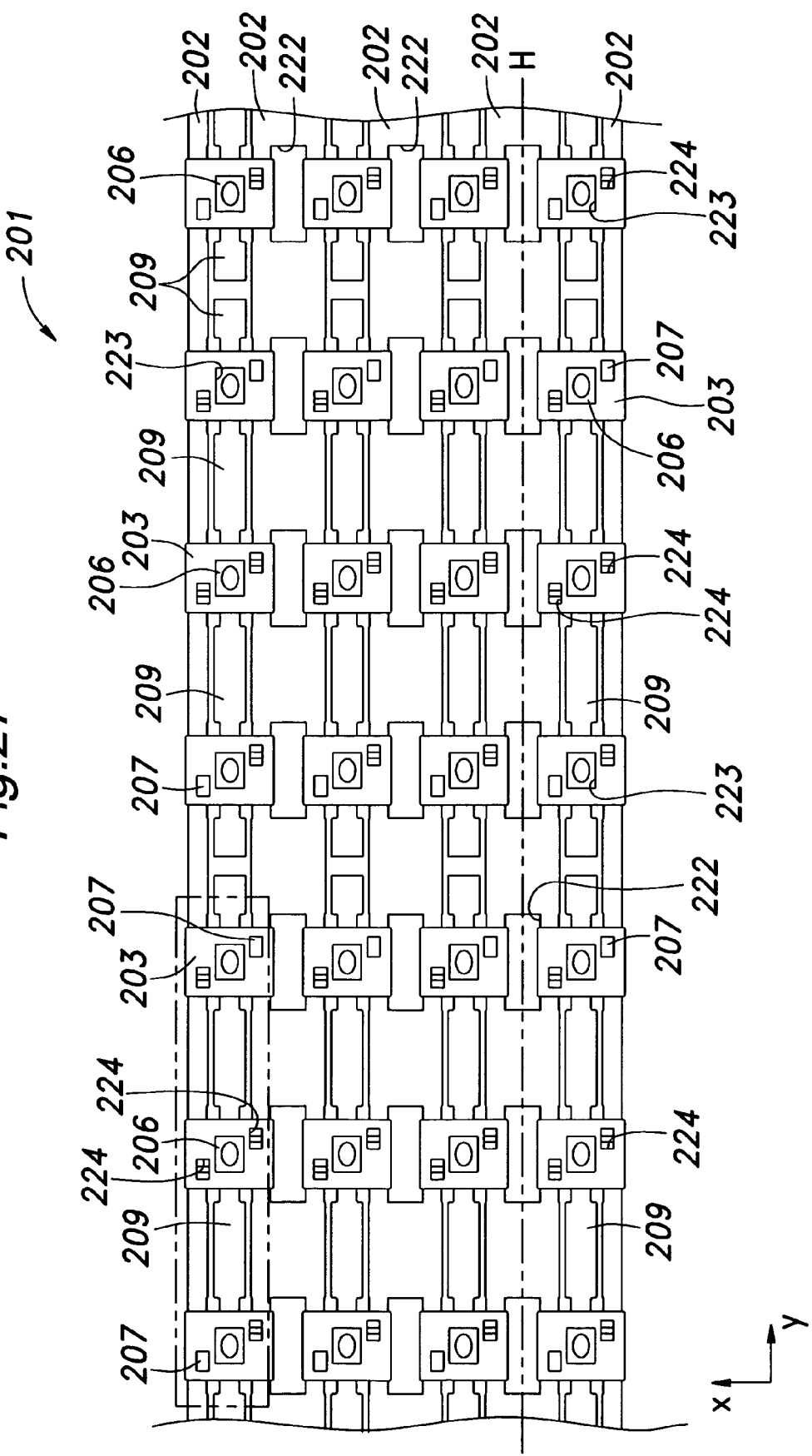
FIG. 27 is a partial plan view showing another embodiment of a light emitting module according to the present invention.

FIG. 27 is a partial plan view showing another embodiment of a light emitting module according to the present invention. This light emitting module 201 comprises: a plurality (five in this embodiment) of thin plate-shaped conductors 202 spaced apart from each other in a first direction (or x-axis direction) and extending in a second direction (or y-axis direction) substantially perpendicular to the first direction; a plurality of insulating joint members 203 for mechanically joining the conductors 202; and a plurality of chip-type LEDs 206 connected between adjoining conductors 202 to serve as light sources. The LEDs 206 are arranged in a matrix pattern with predetermined intervals in the first and second directions. The insulating joint members 203 are provided for respective LEDs 206 and each insulating joint member 203 is formed with an opening 223 for accommodating the LED 206 therein. Such insulating joint members 203 can be preferably formed by molding a resin material. In the light emitting module of FIG. 27, a plurality of LED series-connections, each of which comprises a plurality (three in this embodiment) of series-connected LEDs 206, are connected between adjoining conductors 202 to form a so-called series-parallel connection.

Figure 28:
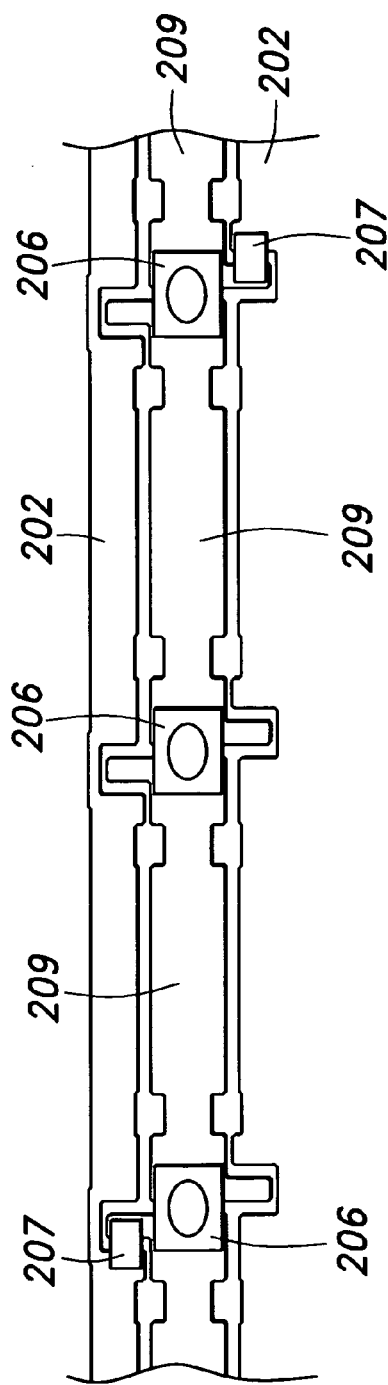
FIG. 28 is an enlarged plan view showing a portion encircled by broken lines in FIG. 27 with joint members 203 being omitted.

FIG. 28 is an enlarged plan view showing a portion encircled by broken lines in FIG. 27, with the insulating joint members 203 being omitted to show electric connection of a single LED series-connection. As shown, disposed between adjoining conductors 202 are a plurality of conductive pieces 209 which are spaced apart from each other in a direction of extension of the conductors 202, and each LED 206 is connected between an associated pair of conductive pieces 209. The conductive pieces 209 positioned at either end of each LED series-connection are connected to the conductors 202 via respective resistors 207. As shown in FIG. 27, each joint member 203 is formed with two openings 224 that can receive the resistors 207 in addition to the opening 223 for receiving the LED 6, and when the resistors 207 are not inserted, the openings 224 expose conductors 202 and conductive pieces 209.

Figure 29:
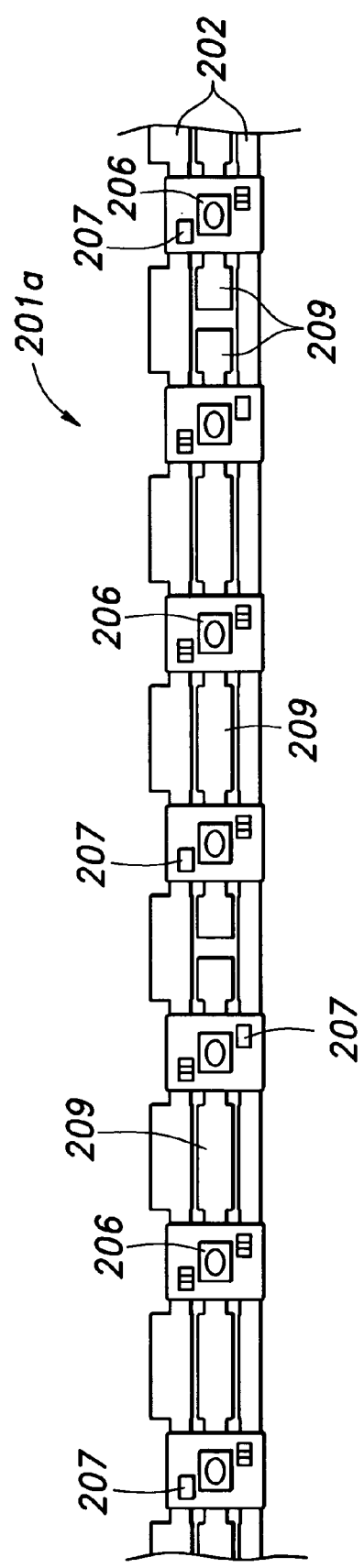
FIG. 29 is a partial plan view of a light emitting module formed by cutting the conductor 202 along the line H in FIG. 27.

In the light emitting module 201 also, the conductors 202 are joined by the insulating joint members 203, and thus stress will not be imposed upon electric connections between the conductors 202 and the LEDs 206. Further, it is possible to cut the light emitting module 201 along the line H in FIG. 27, for example, to form a linear light emitting module 201a having the LEDs 206 arranged in a line as shown in FIG. 29. It is further possible to form a plurality of light emitting modules as above or of any other shapes and arrange them in a variety of patterns.

Figure 30:
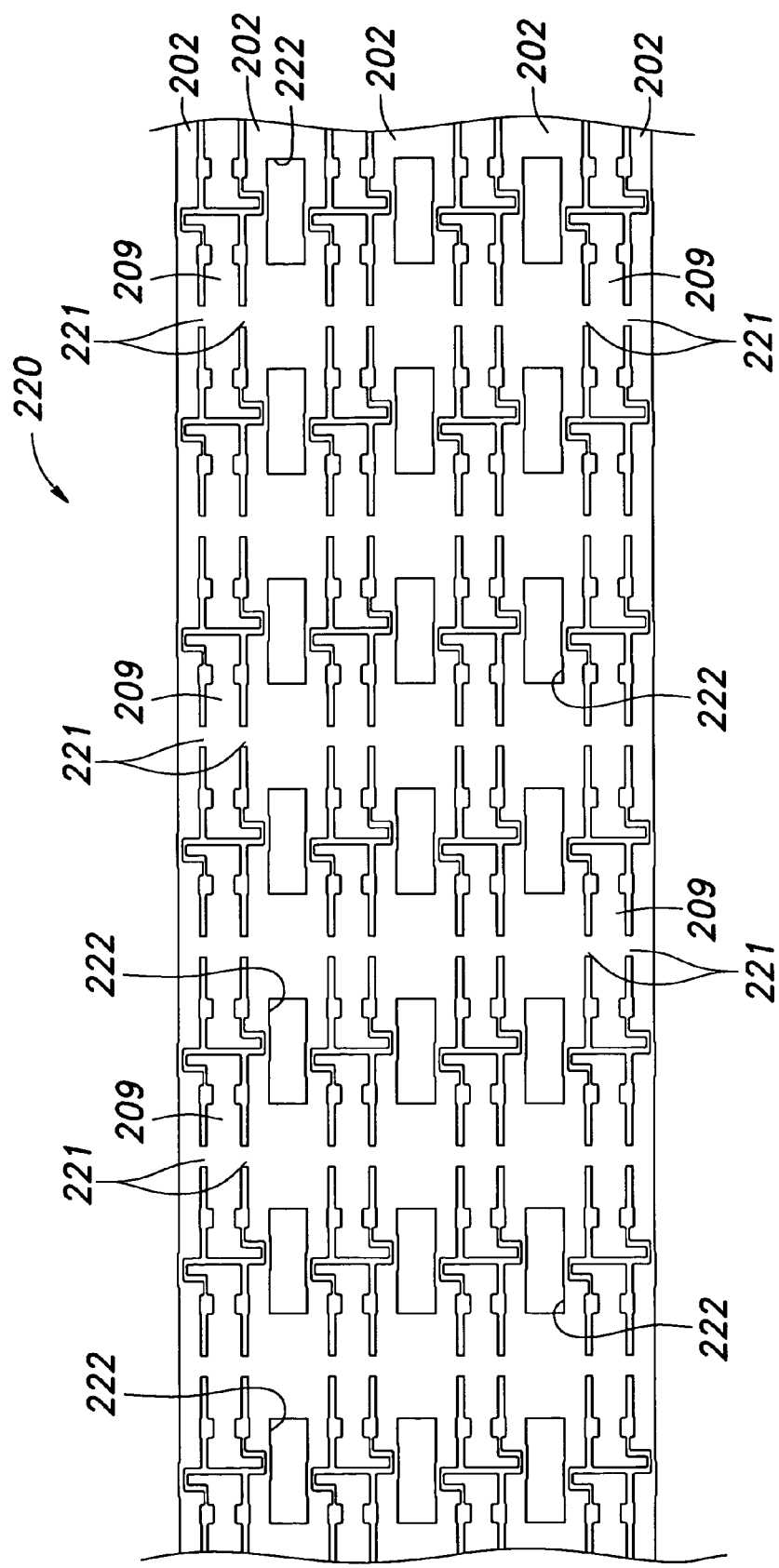
FIG. 30 is a partial plan view showing a patterned conductor suitable for forming the light emitting module of FIG. 27.

FIG. 30 is a partial plan view showing a patterned conductor 220 suitable for forming the light emitting module 201 shown in FIG. 27. This patterned conductor 220 comprises a plurality of conductive pieces 209 which are disposed between adjoining conductors 202 and spaced apart in a direction of extension of the conductors 202, and each conductive piece 209 is connected to the conductors 202 via connection pieces 221. The relatively wide conductors 202 disposed at an intermediate position are formed with substantially rectangular holes 222. The insulating joint members 202 extend through the holes 222 in the direction of thickness of the conductors 202 so that a shift between the joint members 203 and the conductors 202 is prevented.

Figure 31:
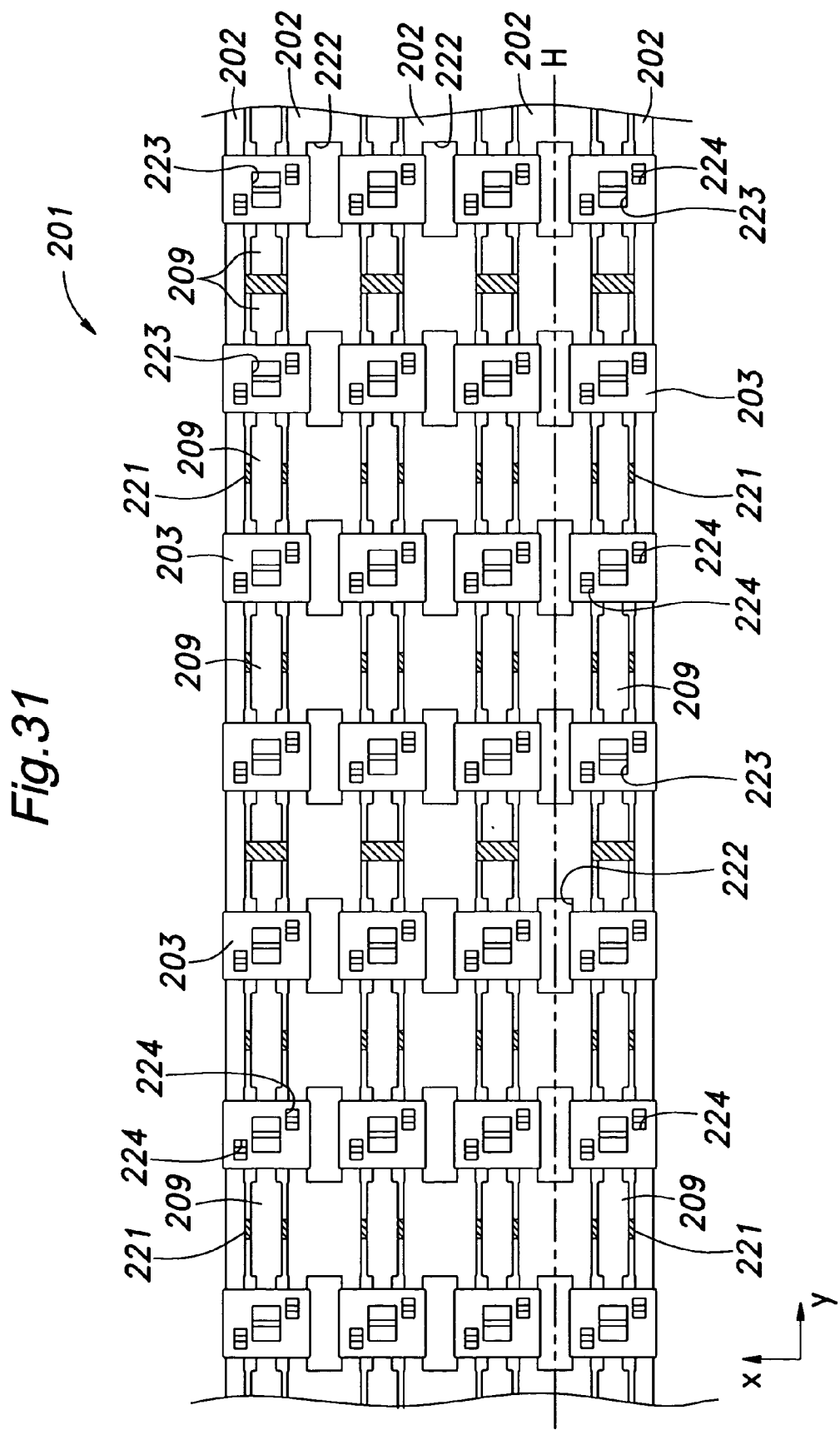
FIG. 31 is a partial plan view showing a state of the patterned conductor of FIG. 30 attached with joint members.

As shown in FIG. 31, after the insulating joint members 203 are formed to hold the conductors 202 of the patterned conductor 210, the connection pieces 221 are cut off and the conductive pieces 209 positioned between adjoining LED series-connections are parted as indicated by hatching in the drawing. Subsequently, the LEDs 206 are inserted into the openings 223 of the insulating joint members (or sockets) 203 and resistors 207 are inserted into appropriate ones of the openings 224 of the insulating joint members 203, followed by attaching the LEDs 206 and resistors 207 to the conductors 202 and conductive pieces 209 to make the light emitting module 201 shown in FIG. 27. As will be appreciated, the number of series connected LEDs 206 in each LED series-connections connected between adjoining conductors 202 can be arbitrarily selected by changing the attachment positions of the resistors 207 and the conductive pieces 209 that are parted. As a specific example, when only a single LED 206 is included in each LED series-connection, the LEDs 206 are connected in parallel between the adjoining conductors 202. As another example, the number of LED series-connections connected between the adjoining conductors 202 may be one. Thus, according to this embodiment, it is possible to make light emitting modules 201 that connect the LEDs 206 between adjoining conductors 202 in arbitrary connection patterns, such as series, parallel or series-parallel connections, at low cost by using a common patterned conductor 210 and changing the attachment positions of the resistors 207 and the conductive pieces 209 to be parted.

Figure 32:
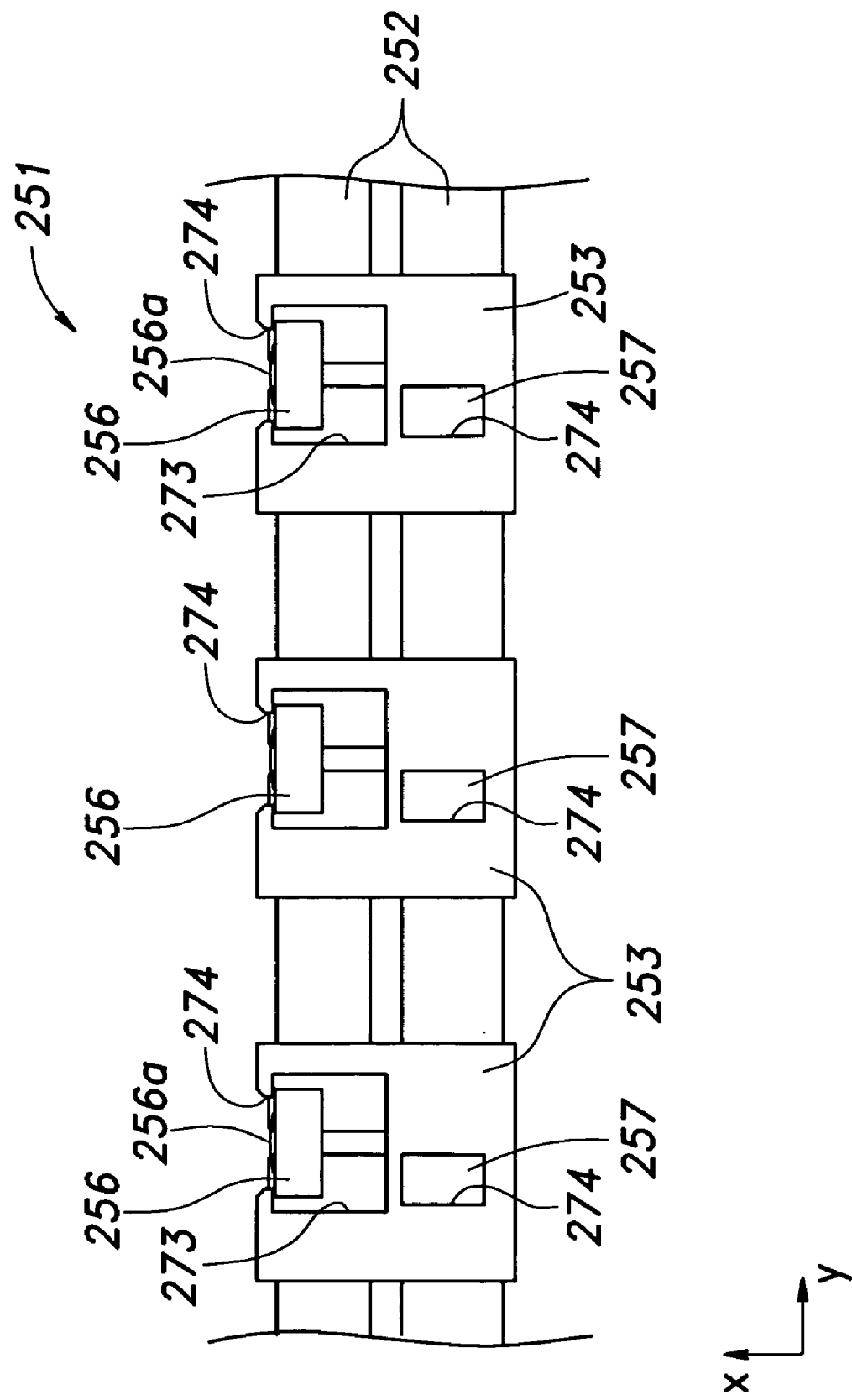
FIG. 32 is a partial plan view showing another embodiment of a light emitting module according to the present invention.

FIG. 32 is a partial plan view showing yet another embodiment of a light emitting module according to the present invention. This light emitting module 251 comprises: a pair of thin plate-shaped conductors 252 spaced apart from each other in a first direction (or x-axis direction) and extending in a second direction (or y-axis direction) substantially perpendicular to the first direction; a plurality of insulating joint members 253 for mechanically joining the conductors 252; and a plurality of side-view LEDs 256 arranged in the direction of extension of the conductors 252 to serve as light sources. The side-view LED 256 has a light emitting surface 256a on its side and electric connection terminals (not shown) on its underside. The insulating joint members 253 are provided for individual LEDs 256, and each joint member 253 is formed with an opening 273 for receiving the LED 256. Further, in order not to interfere with the light emitted from the side-view LED 256, part of the side walls defining the opening 273 of each insulating joint member 253 is removed to form a window 274. Such an insulating joint member 253 can be preferably formed by molding a resin material.

FIG. 33 is a partial plan view omitting the insulating joint members 253 in order to show the way of connection of the LEDs 256 to the conductors 252. As shown, the upper conductor 252 in the drawing has widthwise (or in the first direction) recesses 261 on a side facing away from the lower conductor 252, and conductive pieces 259 are disposed in the recesses 261 where each LED 256 is connected between the associated conductive piece 259 and the conductor 252. Further, the conductive pieces 259 are connected to the lower conductor 252 via resistors 257 that stride across the upper conductor 252, as a result of which each LED 256 and its associated resistor 257 are connected in series between the conductors 252. The resistance of each resistor 257 can be determined appropriately depending on the characteristics of the corresponding LED 256. As shown in FIG. 32, each insulating joint member 253 is formed with an opening 274 for receiving the resistor in addition to the opening 274 for receiving the LED 256. Owing to such a structure, it is possible that the conductive piece 259 and a portion of the conductor 252 to which the terminals of the LED 256 are to be connected can be spaced apart in the direction of extension of the conductors 252 such that when the side-view LED 256 is attached, its light emitting surface 256a faces in the widthwise direction of the conductors 252. Further, by positioning the LED 256 such that its light emitting surface 256a is substantially aligned with an widthwise edge of the conductor 252, it can be prevented that the conductor 252 interferes with the light emitted from the LED 256.

FIG. 34 is a partial plan view showing a patterned conductor 270 suitable for forming the light emitting module 251 as shown in FIG. 32. Such a patterned conductor 270 can be formed easily by press-working a thin plate-shaped conductor (such as a metal). After forming the insulating joint members 253 by molding a resin material onto the patterned conductor and cutting off the connection pieces 271, 272, the LEDs 256 and resistors 257 are attached to the conductors 252 and conductive pieces 259 to form the light emitting module 251 as shown in FIG. 32. The light emitting module 251 can be cut to form a smaller light emitting module(s). In this embodiment, the dimensions of the opening 273 of each insulating joint member 253 are determined such that not only the side-view LEDs 256 but also normal-view LEDs (or LEDs having a light emitting surface on their top) may be used.

Although the present invention has been described in terms of preferred embodiments thereof the embodiments are presented for illustrative purposes only and the present invention should not be limited to the embodiments. It is obvious to a person having ordinary skill in the art that various alterations and modifications are possible without departing from the scope of the present invention which is set forth in the appended claims. For instance, in the above embodiments, bullet-type LEDs or chip-type LEDs, which are formed by bonding a bare-chip LED (or die) onto terminals for electric connection and encapsulating it by a resin, are used as light sources. However, the bare-chip LEDs before encapsulation may be used as light sources in the light emitting module of the present invention. Such bare-chip LEDs may be commercially available from Toyota Gosei Kabushiki Kaisha of Japan, for example. It is possible to bond a bare-chip LED onto the conductor 52 exposed by the opening 56 of the insulating joint member (socket) 53 shown in FIG. 9, for example, and then fill the opening 56 with a transparent resin for protecting the bare-chip LED. This can reduce the manufacturing cost of the light emitting module.

INDUSTRIAL APPLICABILITY

In a light emitting module according to one aspect of the present invention, the conductors are joined by the insulating joint members so as to prevent stress from being imposed upon connections between the light sources and conductors, while the both sides of the portions of the conductors where the light sources are mounted are exposed so that the heat generated from the light sources can be quickly dissipated.

In a light emitting module according to another aspect of the present invention, the conductors are joined by insulating joint members which are space apart from each other, and the conductors are exposed between adjoining joint members. This can prevent stress from being applied upon the connections between the light sources and the conductors, while allowing heat generated from the light sources to be dissipated from the exposed portions of the conductors. Further, it is possible to bend the exposed portions of the conductors to adjust the shape of the light emitting module in conformity with the shape of a support member or the like, or vary the direction of lights emitted from the light sources.

In a light emitting module according to yet another aspect of the present invention, the insulating joint members for joining a plurality of conductors are each formed with an opening for exposing the conductors to which the light sources such as LEDs are mounted. The portions of the conductors exposed by the openings are each surrounded by the insulating joint member and thus are hard to deform. This can further reduce stress imposed upon the connections between the light sources and conductors. By determining the dimensions of the openings so as to match those of the light sources, the insulating joint members can serve as sockets to facilitate attachment of the light sources.

The invention claimed is:

1. A light emitting module comprising:
a plurality of thin plate-shaped conductors spaced apart from each other in a first direction;
at least one light source connected between at least one pair of adjoining ones of said conductors; and
at least one insulating joint member for mechanically joining said plurality of conductors,
wherein said at least one insulating joint member has an opening exposing at least one side of a portion of said conductors, and said light source is inserted into said opening to be connected to said exposed portion of the conductors, and
wherein said opening exposes both sides of said conductors.

2. A light emitting module according to claim 1, wherein said opening has a first opening into which said light source is inserted, and a second opening located at an opposite position with respect to said conductors, wherein said second opening diverges in a direction away from said conductors.

3. A light emitting module according to claim 1, wherein said light source comprises a chip-type LED, and said portion of said conductors exposed by said opening of said insulating joint member is provided with extensions for resiliently contacting electric connection terminals of said chip-type LED.

4. A light emitting module comprising:
a plurality of thin plate-shaped conductors spaced apart from each other in a first direction;
at least one light source connected between at least one pair of adjoining ones of said conductors; and
at least one insulating joint member for mechanically joining said plurality of conductors,
wherein said at least one insulating joint member has an opening exposing at least one side of a portion of said conductors, and said light source is inserted into said opening to be connected to said exposed portion of the conductors, and
wherein dimensions of said opening are determined so as to substantially match those of said light source such that said insulating joint member having the opening serves as a socket for said light source.

5. A light emitting module comprising:
a plurality of thin plate-shaped conductors spaced apart from each other in a first direction;
at least one light source connected between at least one pair of adjoining ones of said conductors; and
at least one insulating joint member for mechanically joining said plurality of conductors,
wherein said at least one insulating joint member has an opening exposing at least one side of a portion of said conductors, and said light source is inserted into said opening to be connected to said exposed portion of the conductors,
wherein said opening exposes both sides of said conductors,
wherein said light source comprises a chip-type LED, and said portion of said conductors exposed by said opening of said insulating joint member is provided with extensions for resiliently contacting electric connection terminals of said chip-type LED, and
wherein said insulating joint member has side walls for defining said opening, and a portion of said side walls is formed with an engagement finger for engaging with an upper surface of said chip-type LED when the chip-type LED is inserted into said opening.

6. A light emitting module comprising:
a plurality of thin plate-shaped conductors spaced apart from each other in a first direction;
at least one light source connected between at least one pair of adjoining ones of said conductors; and
at least one insulating joint member for mechanically joining said plurality of conductors,
wherein said at least one insulating joint member has an opening exposing at least one side of a portion of said conductors, and said light source is inserted into said opening to be connected to said exposed portion of the conductors,
wherein said opening exposes both sides of said conductors,
wherein said light source comprises a bullet-type LED having a pair of substantially parallel extending leads,
wherein said insulating joint member has a partition wall within said opening into which said bullet-type LED is inserted, said partition wall extending across said opening in a second direction substantially perpendicular to said first direction,
wherein said portion of said conductors which is exposed by said opening of said insulating joint member and to which said bullet-type LED is mounted has extensions each extending in said first direction to contact said partition wall or to form a small gap between said partition wall and said extensions, and
wherein said pair of leads of said bullet-type LED are pushed in between said partition wall and said extensions and cramped by them.

7. A light emitting module comprising:
at least three thin plate-shaped conductors spaced apart from each other in a first direction;
a plurality of electric elements each connected between associated pair of said conductors such that said plurality of electric elements are connected in series; and
an insulating joint member mechanically joining said at least three conductors,
wherein said electric elements comprise at least one light source, and
wherein said insulating joint member exposes a portion of said at least three conductors, and said exposed portion is formed with holes or grooves extending in a second direction substantially perpendicular to said first direction whereby said conductors can be bent along said holes or grooves.

8. A light emitting module, comprising:
a plurality of thin plate-shaped conductors spaced apart from each other in a first direction and extending continuously in a second direction substantially perpendicular to said first direction;
a plurality of light sources connected between at least one pair of adjoining ones of said conductors; and
a plurality of insulating joint members for mechanically joining said plurality of conductors, the plurality of insulating joint members being separate members from each other,
wherein said insulating joint members are spaced apart from each other in said second direction such that said conductors are exposed between adjoining ones of said insulating joint members.

9. A light emitting module according to claim 8,
wherein said plurality of insulating joint members are spaced apart in both of said first and second directions whereby said conductors are exposed between adjoining ones of said insulating joint members.

10. A light emitting module according to claim 8, wherein said plurality of light sources comprise a bare-chip LED.

11. A light emitting module according to claim 8, further comprising a plurality of conductive pieces disposed between adjoining ones of said conductors so as to be spaced apart from each other in said second direction, wherein said plurality of light sources are each connected between adjoining ones of said conductive pieces, and wherein said plurality of insulating joint members mechanically join said plurality of conductors and said conductive pieces.

12. A light emitting module according to claim 8, wherein said plurality of conductors comprise first and second conductors spaced apart from each other in said first direction and extending in said second direction, wherein said first conductor has a widthwise recess in which a conductive piece is disposed such that said conductive piece is spaced apart from a portion of said first conductor in said second direction, and wherein said light source is connected to said conductive piece and said portion of said first conductor which are spaced apart from each other in said second direction, and said conductive piece is connected to said second conductor via a resistor.

13. A light emitting module comprising:

a plurality of thin plate-shaped conductors spaced apart from each other in a first direction and extending in a second direction substantially perpendicular to said first direction;

at least one light source each connected between an associated pair of said conductors; and a plurality of insulating joint members for mechanically joining said plurality of conductors, wherein a resistor is connected in series with each of said at least one light source, and wherein said insulating joint members are provided one for each of said at least one light source, and each of said insulating joint members is formed with openings for receiving an associated light source and resistor connected in series to said light source.

14. A light emitting module comprising:

a plurality of thin plate-shaped conductors spaced apart from each other in a first direction and extending in a second direction substantially perpendicular to said first direction;

at least one light source each connected between an associated pair of said conductors; and a plurality of insulating joint members for mechanically joining said plurality of conductors, wherein a resistor is connected in series with each of said at least one light source, and wherein a conductive piece is provided between adjoining ones of said plurality of thin plate-shaped conductors such that said series-connected at least one light source and resistor are connected to each other via said conductive piece, and wherein said insulating joint member mechanically joins said conductive piece and said conductors.

15. A light emitting module comprising:

first and second conductors spaced apart from each other in a first direction and extending in a second direction substantially perpendicular to said first direction; and at least one light source connected between said first and second conductors, wherein said first conductor has a widthwise recess in which a conductive piece is disposed such that said conductive piece is spaced apart from a portion of said first conductor in said second direction, wherein said at least one light source is connected to said conductive piece and said portion of said first conductor which are spaced apart from each other in said second direction, and said conductive piece is connected to said second conductor via a resistor, and wherein said widthwise recess of said first conductor is provided on a side facing away from said second conductor, and said resistor strides across said first conductor to connect said conductive piece to said second conductor.

\* \* \* \* \*